(12) United States Patent
Vellanki et al.

(10) Patent No.: US 11,176,307 B2
(45) Date of Patent: Nov. 16, 2021

(54) METHOD AND SYSTEM FOR PATTERN CONFIGURATION

(71) Applicant: ASML NETHERLANDS B.V., Veldhoven (NL)

(72) Inventors: Venugopal Vellanki, San Jose, CA (US); Been-Der Chen, Milpitas, CA (US)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 16/349,317

(22) PCT Filed: Nov. 13, 2017

(86) PCT No.: PCT/EP2017/079033
§ 371 (c)(1),
(2) Date: May 13, 2019

(87) PCT Pub. No.: WO2018/099716
PCT Pub. Date: Jun. 7, 2018

(65) Prior Publication Data
US 2020/0193080 A1 Jun. 18, 2020

Related U.S. Application Data

(60) Provisional application No. 62/428,904, filed on Dec. 1, 2016.

(51) Int. Cl.
*G06F 30/398* (2020.01)
*G06F 30/392* (2020.01)
(Continued)

(52) U.S. Cl.
CPC .............. *G06F 30/398* (2020.01); *G03F 1/36* (2013.01); *G03F 7/70441* (2013.01); *G06F 30/392* (2020.01)

(58) Field of Classification Search
CPC .............................. G06F 30/398; G06F 30/392
(Continued)

(56) References Cited

U.S. PATENT DOCUMENTS 5,723,233 A 3/1998 Garza et al.
5,821,014 A 10/1998 Chen et al.
(Continued)

FOREIGN PATENT DOCUMENTS

CN 1612046 5/2005
CN 1612047 5/2005
(Continued)

OTHER PUBLICATIONS

International Search Report and Written Opinion issued in corresponding PCT Patent Application No. PCT/EP2017/079033, dated Feb. 16, 2018.
(Continued)

*Primary Examiner* — Suchin Parihar
(74) *Attorney, Agent, or Firm* — Pillsbury Winthrop Shaw Pittman LLP

(57) ABSTRACT

A method including: obtaining a device design pattern layout having a plurality of design pattern polygons; automatically identifying, by a computer, a unit cell of polygons in the device design pattern layout; identifying a plurality of occurrences of the unit cell within the device design pattern layout to build a hierarchy; and performing, by the computer, an optical proximity correction on the device design pattern layout by repeatedly applying an optical proximity correction designed for the unit cell to the occurrences of the unit cell in the hierarchy.

20 Claims, 18 Drawing Sheets

(51) Int. Cl.
*G03F 1/36* (2012.01)
*G03F 7/20* (2006.01)
(58) Field of Classification Search
USPC .......................................................... 716/52
See application file for complete search history.

(56) References Cited

U.S. PATENT DOCUMENTS

| | | | |
|---|---|---|---|
| 5,885,734 A | 3/1999 | Pierrat et al. | |
| 5,969,441 A | 10/1999 | Loopstra et al. | |
| 6,795,952 B1* | 9/2004 | Stine | H01L 22/20 257/E21.525 |
| 6,807,663 B2 | 10/2004 | Cote et al. | |
| 7,000,208 B2 | 2/2006 | Zhang | |
| 7,418,693 B1 | 8/2008 | Gennari et al. | |
| 7,587,704 B2 | 9/2009 | Ye et al. | |
| 10,810,339 B1* | 10/2020 | Ziger | G06F 30/367 |
| 2004/0019869 A1 | 1/2004 | Zhang | |
| 2004/0060034 A1 | 3/2004 | Cote et al. | |
| 2006/0190850 A1* | 8/2006 | Kohle | G03F 1/36 716/53 |
| 2006/0245636 A1* | 11/2006 | Kitamura | G06K 9/036 382/149 |
| 2007/0207393 A1* | 9/2007 | Ikenaga | G03F 1/84 430/5 |
| 2007/0240089 A1* | 10/2007 | Tanaka | G06F 30/398 716/53 |
| 2007/0288876 A1* | 12/2007 | Irmatov | G06F 30/398 716/52 |
| 2008/0134130 A1 | 6/2008 | Baum et al. | |
| 2008/0148218 A1* | 6/2008 | Kawakami | G03F 1/36 716/53 |
| 2009/0157360 A1 | 6/2009 | Ye et al. | |
| 2012/0236994 A1* | 9/2012 | Hieke | H01L 22/12 378/71 |
| 2013/0183832 A1* | 7/2013 | Landis | G03F 1/36 438/758 |
| 2014/0078804 A1* | 3/2014 | Hsieh | G11C 5/063 365/63 |
| 2014/0212024 A1* | 7/2014 | Chen | G01N 23/2251 382/149 |
| 2014/0282334 A1* | 9/2014 | Hu | G01N 21/9501 716/112 |
| 2016/0125120 A1* | 5/2016 | Yu | G06F 30/398 716/52 |
| 2016/0300338 A1* | 10/2016 | Zafar | G06K 9/6201 |
| 2017/0277818 A1* | 9/2017 | Dai | G06F 30/392 |
| 2018/0275521 A1* | 9/2018 | Wallow | G03F 7/70625 |
| 2018/0315671 A1* | 11/2018 | Kim | G03F 1/44 |
| 2018/0341739 A1* | 11/2018 | Schroeder | G06F 30/398 |

FOREIGN PATENT DOCUMENTS

| | | |
|---|---|---|
| CN | 101192252 | 6/2008 |
| EP | 1023640 | 8/2000 |
| JP | 2006039258 | 2/2006 |

OTHER PUBLICATIONS

Chinese Office Action issued in corresponding Chinese Patent Application No. 201780073895.3, dated Sep. 3, 2020.
Chinese Office Action issued in corresponding Chinese Patent Application No. 201780073895.3, dated Aug. 20, 2021.

* cited by examiner

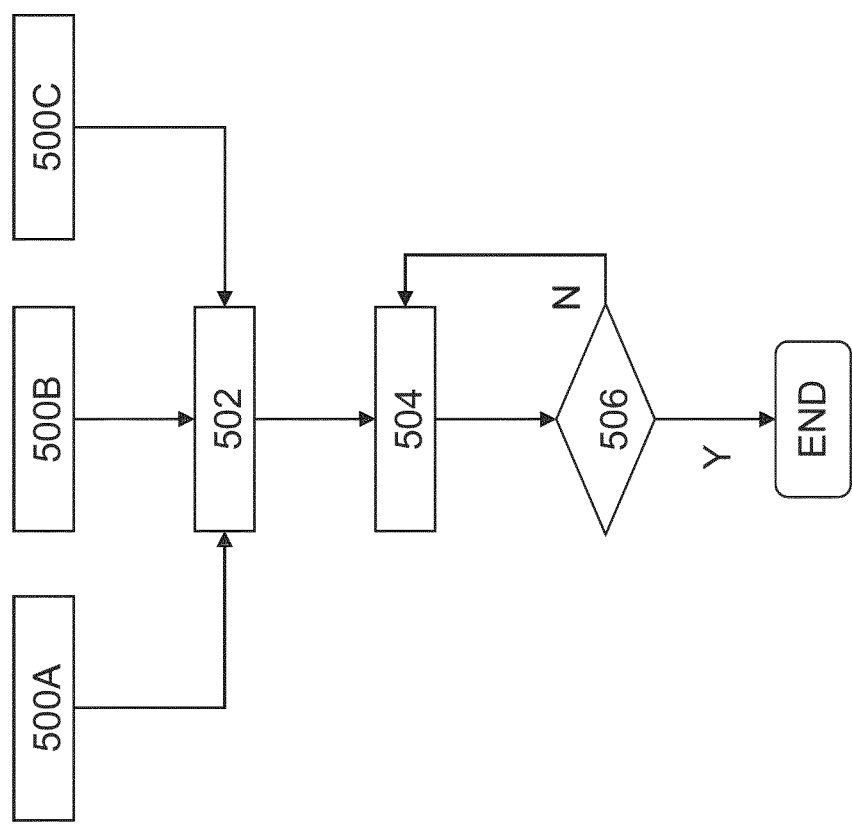

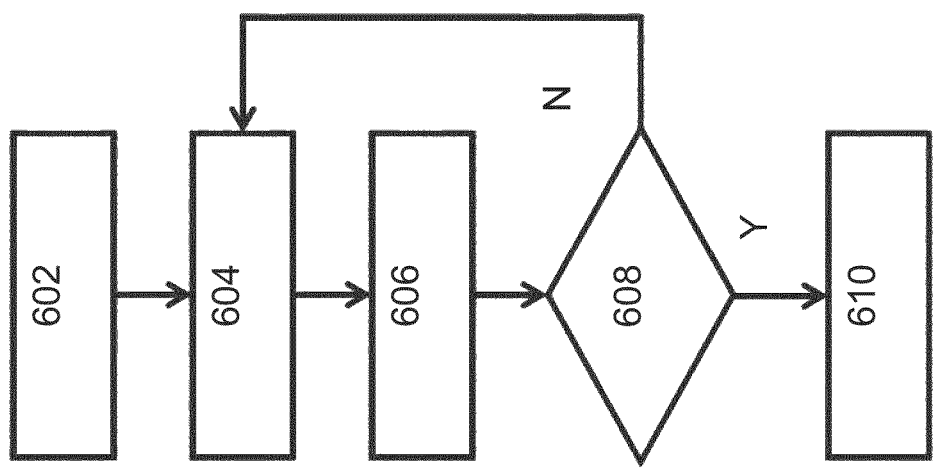

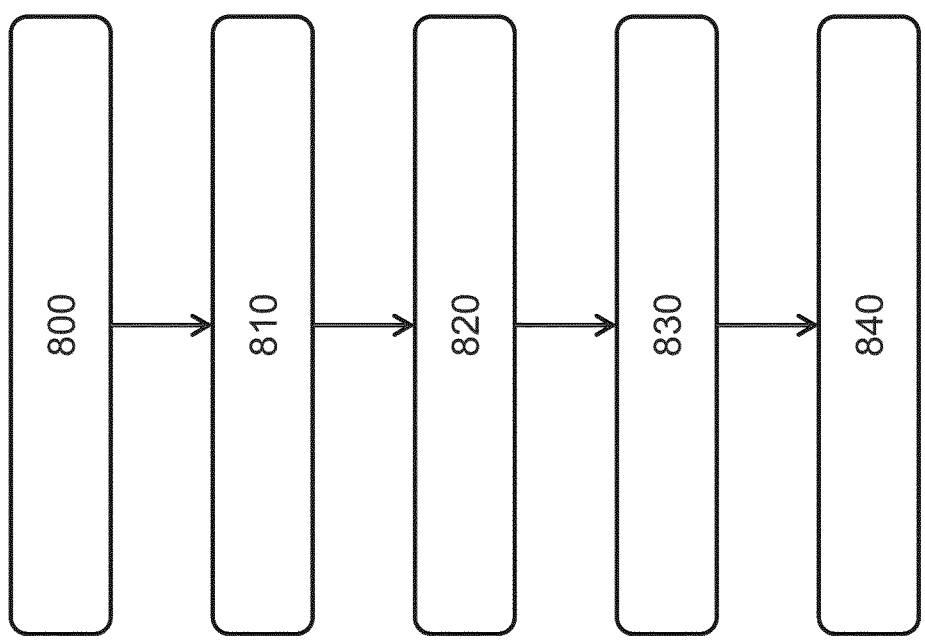

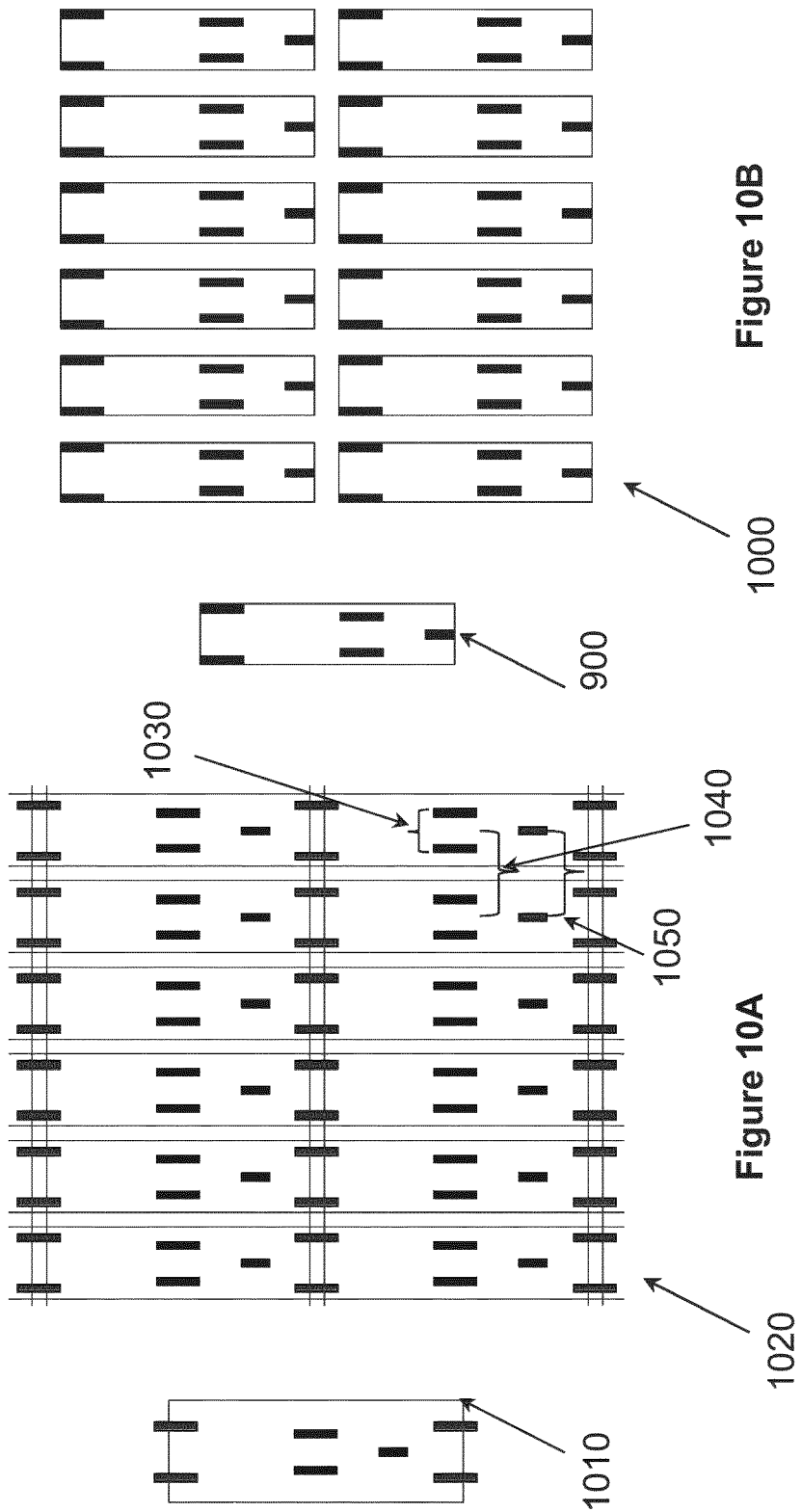

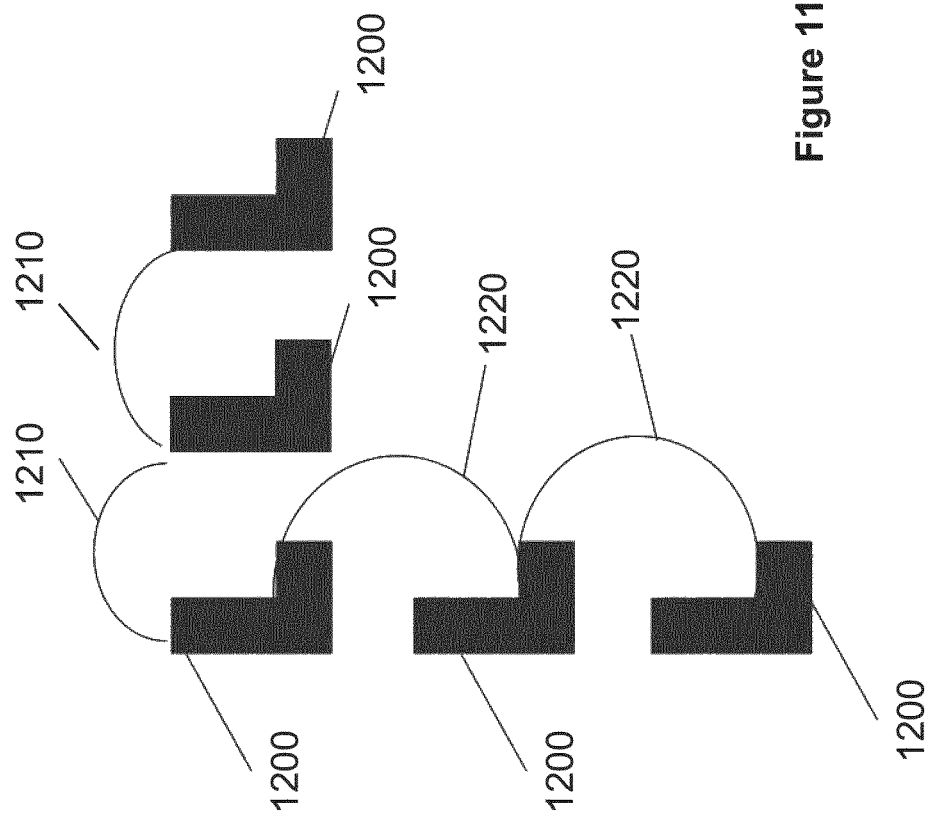

METHOD AND SYSTEM FOR PATTERN CONFIGURATION

CROSS-REFERENCE TO RELATED APPLICATIONS

This application is the U.S. national phase entry of PCT patent application no. PCT/EP2017/079033, which was filed on Nov. 13, 2017, which claims the benefit of priority of U.S. provisional application No. 62/428,904, which was filed on Dec. 1, 2016, and is incorporated herein in its entirety by reference.

FIELD

The description herein relates to patterning device pattern configuration.

BACKGROUND

A lithography apparatus can be used, for example, in the manufacture of integrated circuits (ICs). In such a case, a patterning device (e.g., a mask) may contain or provide a device pattern corresponding to an individual layer of the IC ("design layout"), and this pattern can be transferred onto a target portion (e.g. comprising one or more dies) on a substrate (e.g., silicon wafer) that has been coated with a layer of radiation-sensitive material ("resist"), by methods such as irradiating the target portion through the pattern of the patterning device. In general, a single substrate contains a plurality of adjacent target portions to which the pattern is transferred successively by the lithography apparatus, one target portion at a time. In one type of lithography apparatuses, the pattern of the entire patterning device is transferred onto one target portion in one go; such an apparatus is commonly referred to as a stepper. In an alternative apparatus, commonly referred to as a step-and-scan apparatus, a projection beam scans over the patterning device in a given reference direction (the "scanning" direction) while synchronously moving the substrate parallel or anti-parallel to this reference direction. Different portions of the pattern of the patterning device are transferred to one target portion progressively. Since, in general, the lithography apparatus will have a magnification factor M (generally <1), the speed F at which the substrate is moved will be a factor M times that at which the projection beam scans the patterning device.

Prior to transferring the pattern from the patterning device to the substrate, the substrate may undergo various procedures, such as priming, resist coating and a soft bake. After exposure, the substrate may be subjected to other procedures, such as a post-exposure bake (PEB), development, a hard bake and measurement/inspection of the transferred pattern. This array of procedures is used as a basis to make an individual layer of a device, e.g., an IC. The substrate may then undergo various processes such as etching, ion-implantation (doping), metallization, oxidation, chemo-mechanical polishing, etc., all intended to finish off the individual layer of the device. If several layers are required in the device, then the whole procedure, or a variant thereof, is repeated for each layer. Eventually, a device will be present in each target portion on the substrate. These devices are then separated from one another by a technique such as dicing or sawing, whence the individual devices can be mounted on a carrier, connected to pins, etc.

Thus, manufacturing devices, such as semiconductor devices, typically involves processing a substrate (e.g., a semiconductor wafer) using a number of fabrication processes to form various features and multiple layers of the devices. Such layers and features are typically manufactured and processed using, e.g., deposition, lithography, etch, chemical-mechanical polishing, and ion implantation. Multiple devices may be fabricated on a plurality of dies on a substrate and then separated into individual devices. This device manufacturing process may be considered a patterning process. A patterning process involves a patterning step, such as optical and/or nanoimprint lithography using a patterning device in a lithographic apparatus, to transfer a pattern of the patterning device to a substrate and typically, but optionally, involves one or more related pattern processing steps, such as resist development by a development apparatus, baking of the substrate using a bake tool, etching using the pattern using an etch apparatus, etc.

SUMMARY

In an embodiment, there is provided a method, comprising: obtaining a device design pattern layout comprising a plurality of design pattern polygons; automatically identifying, by a computer, a unit cell of polygons in the device design pattern layout; identifying a plurality of occurrences of the unit cell within the device design pattern layout to build a hierarchy; and performing, by the computer, an optical proximity correction on the device design pattern layout by repeatedly applying an optical proximity correction designed for the unit cell to the occurrences of the unit cell in the hierarchy.

In an embodiment, there is provided a method, comprising: obtaining a device design pattern layout comprising a plurality of design pattern polygons; automatically identifying, by a computer, a unit cell of polygons in the device design pattern layout; identifying a plurality of occurrences of the unit cell within the device design pattern layout; and building, by the computer, a hierarchy based on the identified plurality of occurrences, the hierarchy designed for use in an optical proximity correction of the device design pattern layout.

In an embodiment, there is provided a computer program product comprising a computer non-transitory readable medium having instructions recorded thereon, the instructions when executed by a computer implementing a method as described herein.

BRIEF DESCRIPTION OF THE DRAWINGS

FIG. 4 illustrates a flow diagram illustrating aspects of an example methodology of joint optimization or co-optimization;

FIG. 5 illustrates an embodiment of a further optimization method, according to an embodiment;

FIG. 7 illustrates an exemplary flowchart of a method of design pattern layout processing;

FIGS. 10A and 10B schematically illustrate an embodiment of unit cells and hierarchies for a design pattern layout;

FIG. 11 schematically illustrates an embodiment of identifying a unit cell;

DETAILED DESCRIPTION OF THE DRAWINGS

Figure 1:
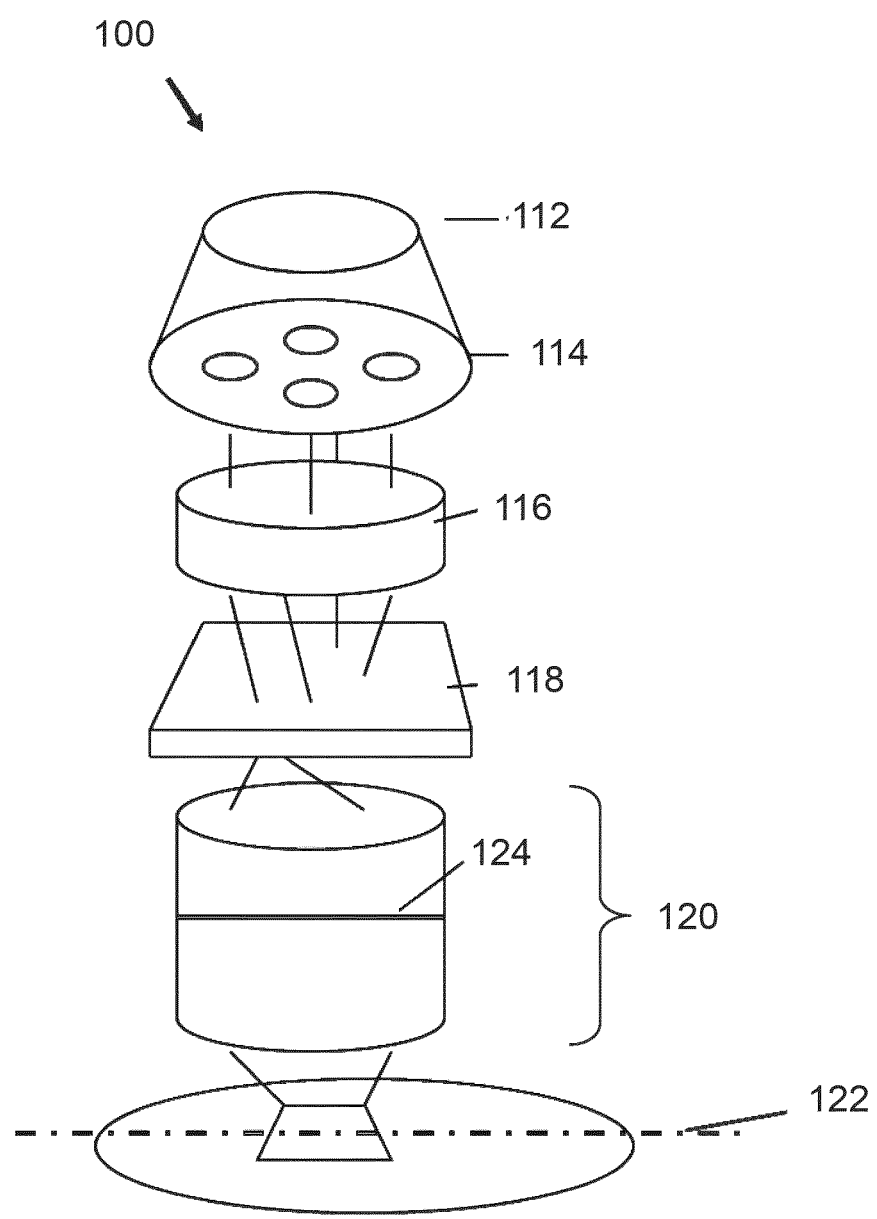
FIG. 1 illustrates a block diagram of various subsystems of a lithography system.

As a brief introduction, FIG. 1 illustrates an exemplary lithography apparatus 100. Major components are a radiation source 112, which may be a deep-ultraviolet excimer laser source or other type of source including an extreme ultra violet (EUV) source (as discussed above, the lithography apparatus itself need not have the radiation source), illumination optics which define the partial coherence (denoted as sigma) of illumination and which may include optics 114 and 116 that shape radiation from the source 112; a support to hold, or that contains, a patterning device 118; and a projection system 120 that projects an image (e.g., via one or more mirrors, one or more transmissive lenses, etc.) of the patterning device pattern onto a substrate plane 122. An adjustable filter or aperture 124 at the pupil plane of the projection system may restrict the range of beam angles that impinge on the substrate plane 122, where the largest possible angle defines the numerical aperture (NA) of the projection system NA=n sin(Θmax), n is the index of refraction of the media between the last element of projection system and the substrate, and Θmax is the largest angle of the beam exiting from the projection system that can still impinge on the substrate plane 122.

The term "projection system" as used herein should be broadly interpreted as encompassing various types of optical systems, including refractive optics, reflective optics, apertures and/or catadioptric optics, for example. The term "projection system" may also include components operating according to any of these design types for directing, shaping or controlling the projection beam of radiation, collectively or singularly.

The term "mask" or "patterning device" as employed in this text may be broadly interpreted as referring to a generic patterning device that can be used to endow an incoming radiation beam with a patterned cross-section, corresponding to a pattern that is to be created in a target portion of the substrate; the term "light valve" can also be used in this context. Besides the classic mask (transmissive or reflective; binary, phase-shifting, hybrid, etc.), examples of other such patterning devices include:

a programmable mirror array. An example of such a device is a matrix-addressable surface having a viscoelastic control layer and a reflective surface. The basic principle behind such an apparatus is that (for example) addressed areas of the reflective surface reflect incident radiation as diffracted radiation, whereas unaddressed areas reflect incident radiation as undiffracted radiation. Using an appropriate filter, the said undiffracted radiation can be filtered out of the reflected beam, leaving only the diffracted radiation behind; in this manner, the beam becomes patterned according to the addressing pattern of the matrix-addressable surface. The required matrix addressing can be performed using suitable electronic means.

a programmable LCD array.

The patterning device referred to above comprises, or can form, one or more design layouts or patterns (hereinafter design pattern layout for convenience) for a device. The device design pattern layout can be generated utilizing CAD (computer-aided design) programs, this process often being referred to as EDA (electronic design automation). Most CAD programs follow a set of predetermined design rules in order to create functional design pattern layouts/patterning devices. These rules are set by processing and design limitations. For example, design rules define the space tolerance between circuit devices (such as gates, capacitors, etc.) or interconnect lines, so as to ensure that the circuit devices or lines do not interact with one another in an undesirable way. One or more of the design rule limitations may be referred to as "critical dimensions" (CD). A critical dimension of a circuit can be defined as the smallest width of a line or hole or the smallest space between two lines or two holes. Thus, the CD determines the overall size and density of the designed circuit.

As noted, lithography is a significant step in the manufacturing of devices, where patterns formed on substrates define functional elements of the devices, such as microprocessors, memory chips, etc. Similar lithographic techniques are also used in the formation of other devices, such as flat panel displays, micro-electro mechanical systems (MEMS), etc.

As patterning processes continue to advance, the dimensions of functional elements have continually been reduced while the amount of functional elements, such as transistors, per device has been steadily increasing over decades. At the current state of technology, layers of devices are manufactured using lithography apparatuses that project a device design pattern layout onto a substrate using illumination from a deep-ultraviolet illumination source, creating individual functional elements having dimensions well below 100 nm, i.e. less than half the wavelength of the radiation from the illumination source (e.g., a 193 nm illumination source).

This process in which features with dimensions smaller than the classical resolution limit of a lithography apparatus are printed, is commonly known as low-k1 lithography, according to the resolution formula $CD=k_1 \times \lambda/NA$, where $\lambda$ is the wavelength of radiation employed, NA is the numerical aperture of projection system in the lithography apparatus, CD is the "critical dimension"—generally the smallest feature size printed, and k1 is an empirical resolution factor. In general, the smaller k1 the more difficult it becomes to reproduce a pattern on the substrate that resembles the shape and dimensions planned by a circuit designer in order to achieve particular electrical functionality and performance. The lower limit value of k1 is often around 0.23 or around 0.25. Therefore, it is desired to be print features (e.g., in terms of CD of the features, in terms of pitch of the features, etc.) below the k1 limit (hereafter "sub-k1 limit" or "below the k1 limit").

But, of course, one of the goals in integrated circuit fabrication is to faithfully reproduce the original circuit design on the substrate (via the patterning device). So, to enable effective reproduction and/or to realize sub-k1 limit pattern features, sophisticated fine-tuning steps are applied to the lithography apparatus and/or device design pattern layout. These include, for example, but not limited to, optimization of NA and optical coherence settings, customized illumination schemes, use of phase shifting patterning devices, splitting the pattern into multiple exposures (hereinafter referring to multiple patterning), optical proximity correction (OPC, sometimes also referred to as "resolution enhancement techniques" (RET) in the device design pattern layout, or other methods.

So, for example, one or more optical proximity correction (OPC) techniques can be utilized to allow a resulting image to more accurately correspond to a desired target pattern and/or to realize sub-k1 limit features. There are various forms of optical proximity correction techniques that configure the patterning device and/or the device pattern layout itself. Sometimes some of these techniques are referred to as resolution enhancement techniques so for convenience they will be all be considered OPC techniques herein.

Typically, the device design pattern layout will comprise a plurality of polygons, the polygons representing features of the design pattern layout. So, OPC techniques will typically manipulate these polygons in terms of shape, size, etc. and/or introduce additional polygons, to help enable the resulting image to be exposed on the resist and to accurately correspond to a desired target pattern. One such OPC technique is to bias the size of one or more pattern polygons, i.e., to make the polygons larger or smaller. Another OPC technique is to modify the shape of one or more pattern polygons, e.g., add a serif. Another OPC technique is to introduce sub-resolution scattering polygons (also referred to as assist features). As described, for example, in U.S. Pat. No. 5,821,014, which is incorporated herein in its entirety by reference, sub-resolution assist features are used as a means to correct for optical proximity effects.

As will be appreciated, these OPC techniques are performed by a hardware computer analyzing an input design pattern layout. This analysis considers how the pattern will be imaged in order to make appropriate OPC adjustments (e.g., biasing, adding serifs, introducing assist features, etc.). To analyze how the pattern will be imaged, a simulation will typically be performed that mathematically models the imaging by a lithography apparatus.

In a lithography apparatus, an illumination system provides illumination (i.e. radiation) in the form of an illumination mode to a patterning device that will impart a design pattern layout to the radiation. A projection system directs and shapes an aerial image of the design pattern layout onto a substrate. The illumination mode defines the characteristics of the illumination, such as the angular or spatial intensity distribution (e.g., conventional, dipole, annular, quadrupole, etc.), an illumination sigma ($\sigma$) setting, etc. An aerial image (AI) is the radiation intensity distribution at substrate level. A resist layer on the substrate is exposed and the aerial image is transferred to the resist layer as a latent "resist image" (RI) therein. The resist image (RI) can be defined as a spatial distribution of solubility of the resist in the resist layer.

Figure 2:
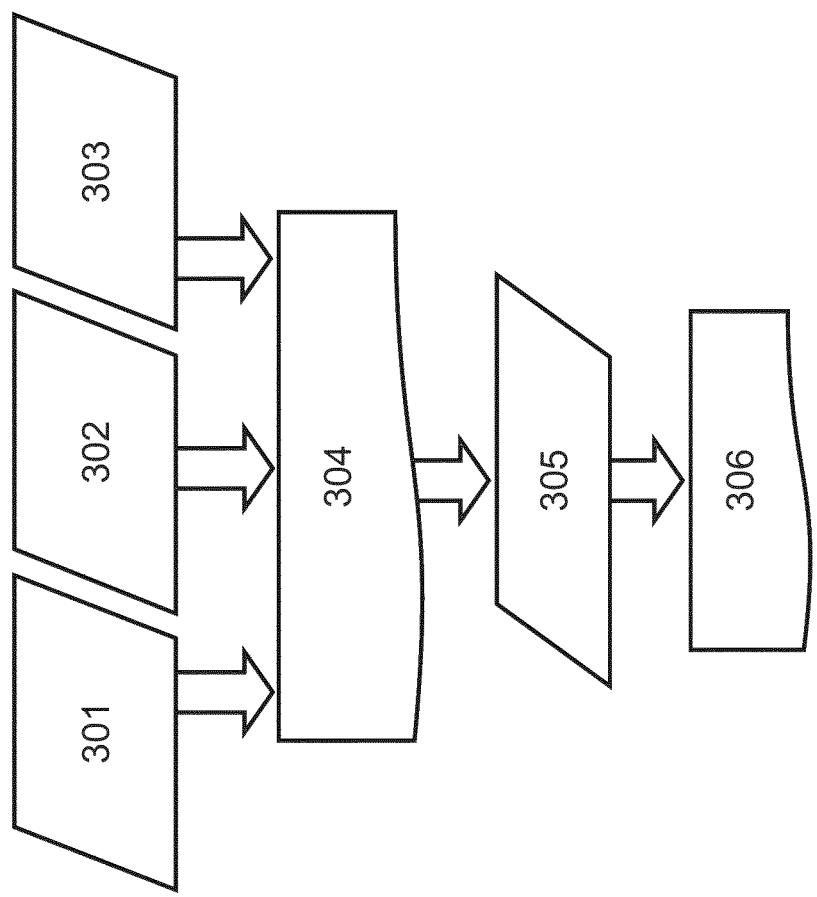
FIG. 2 illustrates a block diagram of simulation models corresponding to subsystems in FIG. 1.

An exemplary flow chart for simulating lithography in a lithography apparatus is illustrated in FIG. 2. An illumination model 301 represents optical characteristics (including radiation intensity distribution and/or phase distribution) of the illumination provided to the patterning device. A projection system model 302 represents optical characteristics (including changes to the radiation intensity distribution and/or the phase distribution caused by the projection system) of the projection system. A design pattern model 303 represents optical characteristics (including changes to the radiation intensity distribution and/or the phase distribution caused by a given design pattern layout 303) of a design pattern layout, which is the representation of an arrangement of features on or formed by a patterning device. An aerial image 304 can be simulated from the design pattern model 303, the projection system model 302 and the design pattern model 303. A resist image 306 can be simulated from the aerial image 304 using a resist model 305. Simulation of lithography can, for example, predict contours and CDs in the resist image.

More specifically, it is noted that the illumination model 301 can represent the optical characteristics of the illumination mode and/or illumination system that include, but not limited to, a numerical aperture setting, an illumination sigma ($\sigma$) setting, a particular illumination shape (e.g. off-axis radiation illumination such as annular, quadrupole, dipole, etc.), etc. The projection system model 302 can represent the optical characteristics of the projection system, including aberration, distortion, one or more refractive indexes, one or more physical sizes, one or more physical dimensions, etc. The design pattern model 303 can represent one or more physical properties of a physical patterning device, as described, for example, in U.S. Pat. No. 7,587,704, which is incorporated by reference in its entirety. The resist model can be used to calculate the resist image from the aerial image, an example of which can be found in U.S. Patent Application Publication No. U.S. 2009-0157360, the disclosure of which is hereby incorporated by reference in its entirety. The resist model is related only to properties of the resist layer (e.g., effects of chemical processes which occur during exposure, PEB and development). Optical properties of the lithography apparatus (e.g., properties of the illumination mode, the patterning device and the projection system) dictate the aerial image. Since the patterning device used in the lithography apparatus can be changed, it may be desirable to separate the optical properties of the patterning device from the optical properties of the rest of the lithography apparatus including at least the illumination system and the projection system.

So, an objective of the simulation is to accurately predict, for example, edge placement, aerial image intensity slope and/or CD, which can then be compared against an intended design. The intended design is generally defined as a pre-optical proximity correction (OPC) design pattern layout which can be provided in a standardized digital file format such as GDSII or OASIS or other file format.

Thus, an optimization process can be performed, based on the simulation, that configures the design pattern layout and/or patterning device so to enable effective reproduction of the intended design pattern layout. That configuration typically includes application of OPC to the design pattern layout.

In an optimization process of a system, a figure of merit of the system can be represented as a cost function. The optimization process boils down to a process of finding a set of parameters (design variables) of the system that optimizes (e.g., minimizes or maximizes) the cost function. The cost function can have any suitable form depending on the goal of the optimization. For example, the cost function can be weighted root mean square (RMS) (or root mean 2n-th power, where n is a positive integer) of deviations of certain characteristics of the system with respect to the intended values (e.g., ideal values) of these characteristics; the cost function can also be the maximum of these deviations (i.e., worst deviation). The design variables of the system can be confined to finite ranges and/or be interdependent due to practicalities of implementations of the system. In the case of a lithography apparatus, the constraints are often associated with physical properties and characteristics of the hardware such as tunable ranges, and/or patterning device manufacturability design rules.

The optimization may be directed to enlarge the process windows of some of the patterns in the design pattern layout. The process window of a pattern is a space of the processing parameters under which the pattern will be produced within specifications. From a mathematical point of view, a process window is a region in a vector space spanned by all the processing parameters. In a given patterning process, the process window of a pattern is dictated by the specifications of the pattern and the physics involved in the patterning process.

Using a region in a vector space spanned by all the processing parameters as the process window may not be convenient. A region of a subspace (i.e., a space spanned by fewer than all the processing parameters) ("sub-PW") may be used instead of the region the space spanned by all the processing parameters ("full PW"). For example, in a patterning process with many processing parameters, a region of the subspace spanned by focus and dose may be used as a sub-PW.

Processing parameters are parameters of the patterning process. The patterning process may include processes upstream and downstream to the actual lithographic transfer of the pattern. Processing parameters may belong to a number of categories. A first category may be parameters of the lithography apparatus or any other apparatuses used in the patterning process. Examples of this category include parameters of the illumination system, projection system, substrate stage, etc. of a lithography apparatus. A second category may be parameters of any procedures performed in the patterning process. Examples of this category include focus, dose, bandwidth, exposure duration, development temperature, chemical compositions used in development, etc. A third category may be parameters of the design pattern layout. Examples of this category may include optical proximity correction adjustments such as shapes of pattern features and/or locations of assist features. A fourth category may be parameters of the substrate. Examples include characteristics of structures under a resist layer, chemical composition of the resist layer, and/or physical dimensions of the resist layer. A fifth category may be parameters that represent a characteristic of temporal variation of one or more parameters of the patterning process. Examples of this category may include a characteristic of high frequency stage movements (e.g., frequency, amplitude, etc.), a high frequency laser bandwidth change (e.g., frequency, amplitude, etc.) and/or a high frequency laser wavelength change. These high frequency changes or movements are those above the response time of a mechanism to adjust the underlying parameter (e.g., stage position, laser intensity, etc.). A sixth category may be a characteristic upstream or downstream to exposure, such as post-exposure bake (PEB), development, etching, deposition, resist application, doping and/or packaging.

Various patterns in the design pattern layout may have different process windows. Examples of pattern specifications that relate to potential systematic defects include checks for CD, necking, line pull back, line thinning, edge placement, overlapping, resist top loss, resist undercut and/or bridging. The process window of all the patterns in the design pattern layout or a portion thereof may be obtained by merging (e.g., overlapping) process windows of each individual pattern.

Figure 3A:
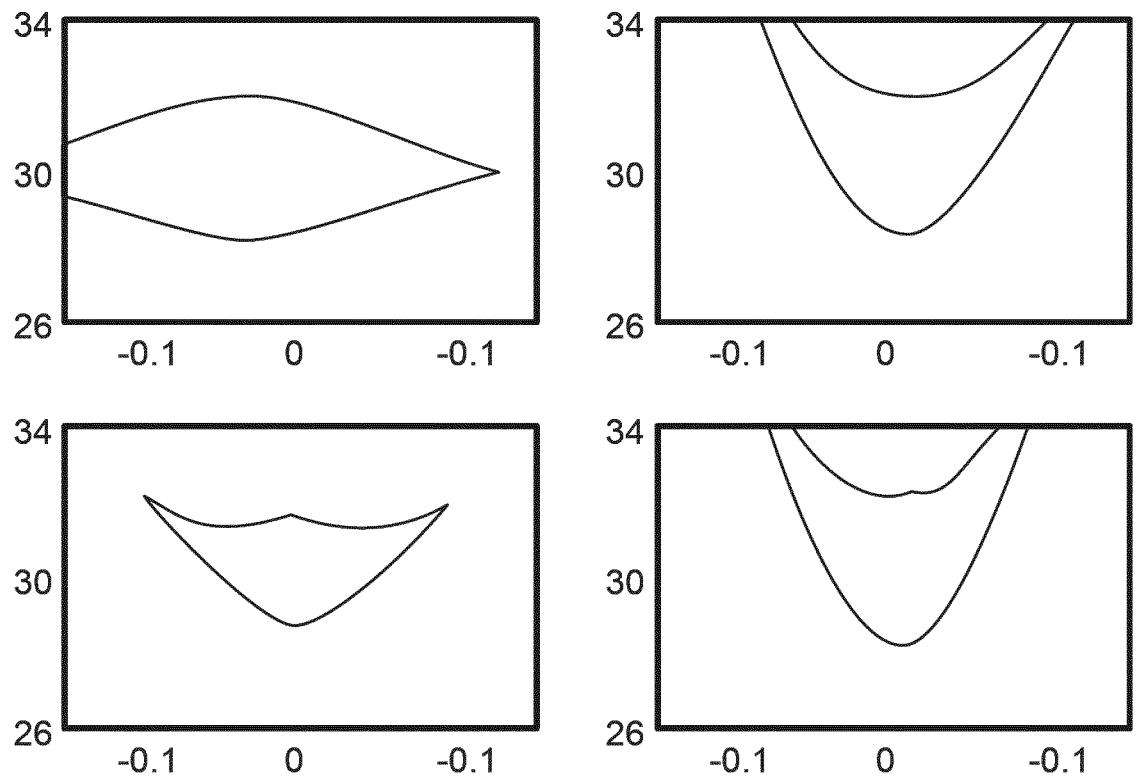
FIG. 3A illustrates sub-process windows spanned by focus (horizontal axis) and dose (vertical axis), for EPE (EPE-PWs) of each of four patterns.
Figure 3B:
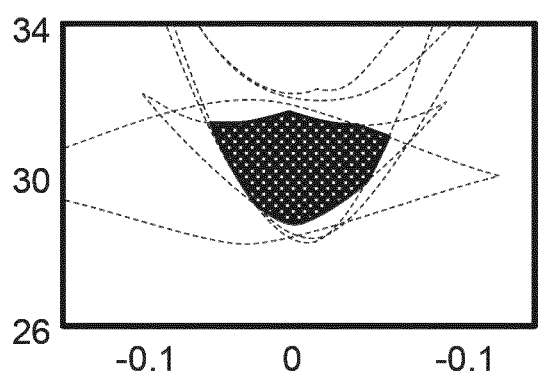
FIG. 3B illustrates a sub-process window (represented by the dot-hatched area), spanned by focus (horizontal axis) and dose (vertical axis), of EPE (EPE-OPW) of the four patterns.

In an example, when the specification of a pattern only dictates the edge placement error (EPE) of the pattern, the process window of the pattern may be called an EPE process window (EPE-PW). When the specification of a pattern only dictates the EPEs of a group of patterns, the overlapping process window of the group of patterns may be called an EPE overlapping process window (EPE-OPW). An EPE-PW or EPE-OPW may have sub-PWs. FIG. 3A shows sub-PWs, spanned by focus (horizontal axis) and dose (vertical axis), of EPE (EPE-PWs) of each of four patterns. FIG. 3B shows a sub-PW (represented by the dot-hatched area), spanned by focus (horizontal axis) and dose (vertical axis), of EPE (EPE-OPW) of the four patterns. Thus, the EPE-OPW is the overlapping area of the EPE-PWs of the four patterns.

As stated above, a cost function may be used in an optimization or configuration process of a system. The cost function may represent one or more figures of merit of the system. A figure of merit of the system may be called a metric of the system. The optimization process finds a set of parameters of the system that optimizes (e.g., minimizes or maximizes) the cost function, under a certain constraint if any. When the cost function is optimized (e.g., minimized or maximized), the one or more figures of merit represented by the cost function are optimized (e.g., minimized or maximized). In a lithography apparatus, as an example, a cost function may be expressed as $$CF(z_1, z_2, \ldots, z_N) = \sum_{p=1}^{P} w_p f_p^2(z_1, z_2, \ldots, z_N) \tag{1}$$

wherein $(z_1, z_2, \ldots, z_N)$ are N design variables or values thereof. $f_p(z_1, z_2, \ldots, z_N)$ can be a figure of merit that is a function of the design variables $(z_1, z_2, \ldots, z_N)$, such as a difference between an actual value and an intended value of a characteristic for a set of values of the design variables of $(z_1, z_2, \ldots, z_N)$. For example, $f_p(z_1, z_2, \ldots, z_N)$ may be a metric characterizing the size of a process window (e.g., EPE-PW). $w_p$ is a weight constant associated with $f_p(z_1, z_2, \ldots, z_N)$. For example, the characteristic may be a position of an edge of a pattern, measured at a given point on the edge. Different $f_p(z_1, z_2, \ldots, z_N)$ may have different weight $w_p$. For example, if a particular edge has a narrow range of permitted positions, the weight $w_p$ for the $f_p(z_1, z_2, \ldots, z_N)$ representing the difference between the actual position and the intended position of the edge may be given a higher value. Of course, $CF(z_1, z_2, \ldots, z_N)$ is not limited to the form in Eq. 1. $CF(z_1, z_2, \ldots, z_N)$ can be in any other suitable form.

The cost function may represent any one or more suitable characteristics of the lithography apparatus, patterning process or the substrate, for instance, edge placement error, CD, image shift, image distortion, image rotation, stochastic variation, throughput, local CD variation, or a combination thereof. In one embodiment, the design variables $(z_1, z_2, \ldots, z_N)$ comprise one or more selected from dose, focus, bias of the patterns of the patterning device pattern, assist feature placement, spatial/angular distribution (e.g., shape such as conventional, annular, dipole, quadrupole, etc.) of illumination, etc. Since it is the resist image that often dictates the pattern on a substrate, the cost function may include a function that represents one or more characteristics of the resist image. For example, $f_p(z_1, z_2, \ldots, z_N)$ can be simply a distance between a point in the resist image to an intended position of that point (i.e., edge placement error $EPE_p(z_1, z_2, \ldots, z_N)$. Further, the cost function may include a function that represents one or more characteristics of any other images after exposure, such as post-develop image, after-etch image, etc. The design variables can include any adjustable parameter such as an adjustable parameter of the illumination system, the patterning device, the projection system, dose, focus, etc.

The design variables may have constraints, which can be expressed as $(z_1, z_2, \ldots, z_N) \in Z$, where Z is a set of possible values of the design variables. One possible constraint on the design variables may be imposed by a desired throughput of the lithography apparatus. Without such a constraint imposed by the desired throughput, the optimization may yield a set of values of the design variables that are unrealistic. For example, if the dose is a design variable, without such a constraint, the optimization may yield a dose value that makes the throughput economically impossible. However, the usefulness of constraints should not be interpreted as a necessity.

The cost function may be repeatedly computed during the optimization process. Computing the cost function may include computing the $f_p (z_1, z_2, \ldots, z_N)$. A non-exhaustive list of examples of the $f_p (z_1, z_2, \ldots, z_N)$ that relate to an image includes one or more EPEs and functions thereof, a process window or a metric characterizing a process window, yield, a stochastic effect, presence or probability of defects, and/or an interlayer characteristic (i.e., a characteristic of a structure relative to another structure when these structures are in different layers).

With the cost function defined and its computation method obtained, the process proceeds, in an embodiment, to find a set of values of the one or more design variables, under the constraints $(z_1, z_2, \ldots, z_N) \in Z$, that optimize the cost function, e.g., to find:

$$(\tilde{z}_1, \tilde{z}_2, \ldots, \tilde{z}_N) = \arg\min_{(z_1, z_2, \ldots, z_N) \in Z} CF(z_1, z_2, \ldots, z_N) \quad (2)$$

So, in an embodiment, there is provided methods and metrics for finding a solution (e.g., a pattern optimization solution, an illumination mode and pattern (SMO) optimization solution, etc.) which maximizes an overlapping edge placement error (EPE) process window for patterning (e.g., DUV and/or EUV patterning). That is, in an embodiment, the solution maximizes the size of the overlapping EPE process window, namely a process parameter space where a plurality of the parts of the pattern has an EPE better than a specification (e.g., within 5% of CD). In an embodiment, a solution found with an EPE minimization algorithm will a give near optimum overlapping EPE process window.

A general method of optimizing is illustrated in FIG. 4. This method comprises a step 502 of defining a multi-variable cost function of a plurality of design variables. The design variables may comprise any suitable combination selected from design variables representing one or more characteristics of the illumination 500A (e.g., pupil fill ratio, namely percentage of radiation of the illumination that passes through a pupil or aperture), one or more characteristics of the projection system 500B, and/or one or more characteristics of the design pattern layout 500C. For example, the design variables may include design variables representing one or more characteristics of the illumination 500A and of the design pattern layout 500C (e.g., global bias) but not of one or more characteristics of the projection system 500B, which leads to an illumination-patterning device pattern (e.g., mask pattern) optimization ("source-mask optimization" or SMO). Or, the design variables may include design variables representing one or more characteristics of the illumination 500A (optionally polarization), of the projection system 500B and of the design pattern layout 500C, which leads to an illumination-patterning device pattern (e.g., mask)-projection system (e.g., lens) optimization ("source-mask-lens optimization" or SMLO). Or, the design variables may include variables representing one or more characteristics of the design pattern layout 500C, which leads to a patterning device (e.g., mask) optimization (MO) and will typically comprise OPC optimization. In step 504, the design variables are simultaneously adjusted so that the cost function is moved towards convergence. In step 506, it is determined whether a predefined termination condition is satisfied. The predetermined termination condition may include various possibilities, e.g., one or more selected from: the cost function is minimized or maximized, as required by the numerical technique used, the value of the cost function is equal to a threshold value or crosses the threshold value, the value of the cost function reaches within a preset error limit, and/or a preset number of iterations is reached. If a condition in step 506 is satisfied, the method ends. If the one or more conditions in step 506 is not satisfied, the steps 504 and 506 are iteratively repeated until a desired result is obtained. The optimization does not necessarily lead to a single set of values for the one or more design variables because there may be a physical restraint, caused by a factor such as pupil fill factor, resist chemistry, throughput, etc. The optimization may provide multiple sets of values for the one or more design variables and associated performance characteristics (e.g., the throughput) and allows a user of the lithographic apparatus to pick one or more sets.

The illumination, patterning device pattern and projection system can be optimized alternately (referred to as Alternate Optimization) or optimized simultaneously (referred to as Simultaneous Optimization). Patterns on multiple layers of the design pattern layout may be optimized simultaneously or alternately. The terms "simultaneous", "simultaneously", "joint" and "jointly" as used herein mean that the one or more design variables representing one or more characteristics of the illumination, patterning device, projection system and/or any other design variable, are allowed to change at the same time. The term "alternate" and "alternately" as used herein mean that not all of the design variables are allowed to change at the same time.

In FIG. 4, the optimization of all the design variables is executed simultaneously. Such a flow may be called simultaneous flow or co-optimization flow. Alternately, the optimization of all the design variables is executed alternately, as illustrated in FIG. 5. In this flow, in each step, some design variables are fixed while other design variables are optimized to optimize the cost function; then in the next step, a different set of variables are fixed while the others are optimized to minimize or maximize the cost function. These steps are executed alternately until convergence or a certain terminating condition is met. As shown in the non-limiting example flowchart of FIG. 5, first, a design pattern layout (step 602) is obtained, then a step of illumination optimization is executed in step 604, where the one or more design variables of the illumination are optimized (SO) using the cost function while other design variables are fixed. Then in the next step 606, a patterning device (e.g., mask) optimization (MO) is performed, where the design variables of the patterning device are optimized using the cost function while other design variables are fixed. These two steps are executed alternately, until a certain terminating condition is met in step 608. One or more various termination conditions can be used, such as the value of the cost function becomes equal to a threshold value, the value of the cost function crosses the threshold value, the value of the cost function reaches within a preset error limit, a preset number of iterations is reached, etc. Note that SO-MO-Alternative-Optimization is used as an example for the alternative flow. The alternative flow can take many different forms, such as SO-LO-MO-Alternative-Optimization, where SO, LO (projection system optimization) is executed, and MO alternately and iteratively; or first SMO can be executed once, then execute LO and MO alternately and iteratively; and so on. Another alternative is SO-PO-MO (illumination optimization, polarization optimization and patterning device optimization) Finally output of the process result is obtained in step 610, and the process stops.

Figure 6:
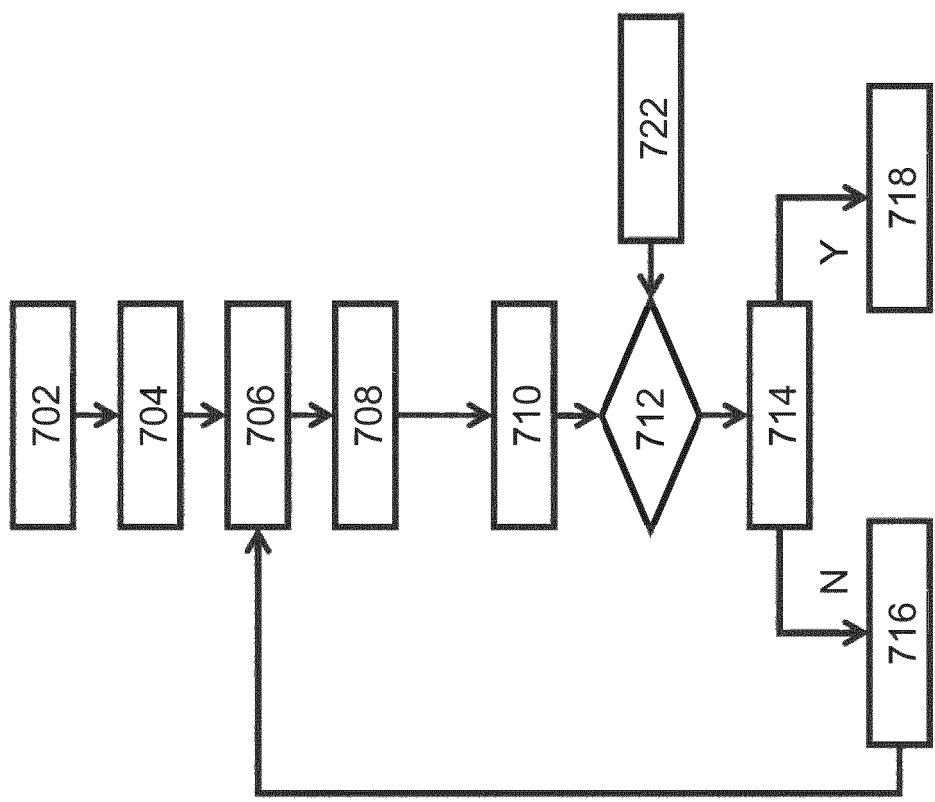
FIG. 6 illustrates an exemplary flowchart of an optimization process.

FIG. 6 shows one exemplary method of optimization, where a cost function representing one or more characteristics of the patterning process is minimized or maximized. In step 702, initial values of one or more design variables are obtained, including one or more associated tuning ranges, if any. In step 704, the multi-variable cost function is set up. In step 706, the cost function is expanded within a small enough neighborhood around the starting point value of the one or more design variables for the first iterative step (i=0). In step 708, standard multi-variable optimization techniques are applied to the cost function. Note that the optimization problem can apply constraints, such as the one or more tuning ranges, during the optimization process in 708 or at a later stage in the optimization process. Each optimization iteration can be performed for the one or more given test features (also known as "gauges") for the characteristics the cost function represents. In step 710, a lithographic response (e.g., EPE or a parameter based on EPE such as the metric described above) is predicted. In step 712, the result of step 710 is compared with a desired or ideal lithographic response value obtained in step 722. If the termination condition is satisfied in step 714, i.e. the optimization generates a lithographic response value sufficiently close to the desired value, then the final value of the design variables is outputted in step 718. The output step may also include outputting one or more other functions using the final values of the design variables, such as outputting an optimized illumination map, an optimized design pattern layout, a wavefront aberration-adjusted map at the pupil plane (or other planes), etc. If the termination condition is not satisfied, then in step 716, the values of the one or more design variables is updated with the result of the i-th iteration, and the process goes back to step 706. The process of FIG. 6 is elaborated in details below.

Optimizing a patterning process can expand the process window. A larger process window provides more flexibility in process design and chip design. The process window can be defined as, for example, a set of focus and dose values for which the resist image is within a certain limit of the design target of the resist image. Note that all the methods discussed here may also be extended to a generalized process window definition that can be established by different or additional base parameters than exposure dose and defocus. These may include, but are not limited to, optical settings such as NA, illumination sigma, optical aberration, polarization, and/or an optical constant of the resist layer. For example, as described earlier, if the process window (PW) also comprises different patterning device pattern bias (mask bias), then the optimization includes the minimization of Mask Error Enhancement Factor (MEEF), which is defined as the ratio between the substrate edge placement error (EPE) and the induced patterning device pattern edge bias. The process window defined on focus and dose values only serve as an example in this disclosure.

A method of maximizing a process window using, for example, dose and focus as its parameters, according to an embodiment, is described below. In a first step, starting from a known condition $(f_0, \varepsilon_0)$ in the process window, wherein $f_0$ is a nominal focus and $\varepsilon_0$ is a nominal dose, minimizing one of the cost functions below in the vicinity $(f_0 \pm \Delta f, \varepsilon_0 \pm \varepsilon)$:

$$CF(z_1, z_2, \ldots, z_N, f_0, \varepsilon_0) = \max_{(f,\varepsilon)=(f_0 \pm \Delta f, \varepsilon_0 \pm \varepsilon)} \max_p |f_p(z_1, z_2, \ldots, z_N, f, \varepsilon)| \quad (7)$$

or $$CS(z_1, z_2, \ldots, z_N, f_0, \varepsilon_0) = \Sigma_{(f,\varepsilon)=(f_0 \pm \Delta f, \varepsilon_0 \pm \varepsilon)} \Sigma_p w_p f_p^2(z_1, z_2, \ldots, z_N, f, \varepsilon) \quad (7')$$

or $$CF(z_1, z_2, \ldots, z_N, f_0, \varepsilon_0) = (1-\lambda) \Sigma_{(f,\varepsilon)=(f_0 \pm \Delta f, \varepsilon_0 \pm \varepsilon)} \Sigma_p w_p f_p^2 (z_1, z_2, \ldots, z_N, f, \varepsilon) + \lambda \max_{(f,\varepsilon)=(f_0 \pm \Delta f, \varepsilon_0 \pm \varepsilon)} \max_p |f_p (z_1, z_2, \ldots, z_N, f, \varepsilon)| \quad (7'')$$

If the nominal focus $f_0$ and nominal dose $\varepsilon_0$ are allowed to shift, they can be optimized jointly with the design variables $(z_1, z_2, \ldots, z_N)$. In the next step, $(f_0 \pm \Delta f, \varepsilon_0 \pm \varepsilon)$ is accepted as part of the process window, if a set of values of $(z_1, z_2, \ldots, z_N)$ can be found such that the cost function is within a preset limit.

If the focus and dose are not allowed to shift, the design variables $(z_1, z_2, \ldots, z_N)$ are optimized with the focus and dose fixed at the nominal focus $f_0$ and nominal dose $\varepsilon_0$. In an alternative embodiment, $(f_0 \pm \Delta f, \varepsilon_0 \pm \gamma)$ is accepted as part of the process window, if a set of values of $(z_1, z_2, \ldots, z_N)$ can be found such that the cost function is within a preset limit.

The methods described earlier in this disclosure can be used to minimize the respective cost functions of Eqs. 7, 7', or 7". If the design variables represent one or more characteristics of the projection system, such as the Zernike coefficients, then minimizing the cost functions of Eqs. 7, 7', or 7" leads to process window maximization based on projection system optimization, i.e., LO. If the design variables represent one or more characteristics of the illumination and patterning device in addition to those of the projection system, then minimizing the cost function of Eqs. 7, 7', or 7" leads to process window maximizing based on SMLO, as illustrated in FIG. 4. If the design variables represented one or more characteristics of the illumination and patterning device, then minimizing the cost functions of Eqs. 7, 7', or 7" leads to process window maximization based on SMO. The cost functions of Eqs. 7, 7', or 7" can also include at least one fp (z_1,z_2, . . . ,z_N) such as described herein, that is a function of the bandwidth.

So, after a particular (e.g., semiconductor) device design is completed, the design is typically "taped-out" in the form of one or more design pattern layout files which form the basis of preparing one or more patterning devices (e.g., the device design may require multiple patterning steps in order to transfer the design onto the substrate and so multiple patterning devices may be required). Accordingly, the design pattern layout is processed to, for example, split the design pattern layout into multiple design pattern layouts for multiple patterning (so called coloring), applying OPC as discussed above, etc. For convenience, the design pattern layout as processed after these steps will be referred to as the post-OPC pattern layout. The post-OPC layout can then be used in the manufacture and/or configuration of a patterning device that can impart the post-OPC design pattern layout to a radiation beam in a lithographic apparatus.

As will be appreciated, software is provided to perform the design pattern layout processing such as the coloring, the optimization processes, the OPC techniques, etc. So, the software obtains (e.g., a user provides) an initial design pattern layout, which will then be processed by the software to realize the post-OPC design pattern layout.

Now, this design pattern layout processing can be time consuming. Accordingly, turn-around time in terms of creating the post-OPC design pattern layout from the initial design pattern layout is a significant factor. Of course, the shorter the time the better. Further, accuracy and quality (e.g., no defects when exposed, optimized process window, consistently accurate imaging, etc.) is also significant factor. Accuracy and turn-around time are interrelated, as more time can lead to better OPC. Hence, a balance should be achieved. Accordingly, it is desirable to improve the design pattern layout processing accuracy and quality as well as turn-around time.

One way to help improve the design pattern layout processing accuracy and quality as well as turn-around time is to perform OPC in a hierarchical mode wherein a hierarchy of pattern features (e.g., the GDS hierarchy) in association with the design pattern layout is used to "re-paste" a previously computed OPC result or recipe a plurality of times. That is, prior to the "re-pasting", a certain set of pattern features of a design pattern layout can have been processed with one or more optical proximity corrections to obtain an OPC result for that set of pattern features or have been analyzed to identify specific features for modification and/or addition by an OPC process to obtain an OPC recipe. The design pattern layout hierarchy can then be scanned for the occurrences of that set of pattern features and then, for each occurrence, the OPC result for that set of pattern features can be inserted into the design pattern layout or the OPC recipe for that set of pattern features can be applied to the design pattern layout. Thus, speed can be achieved since OPC processing doesn't need to be performed for all the pattern features because the "pasted" OPC result or recipe will significantly reduce or eliminate having to perform OPC for those over "pasted" features. Furthermore, accuracy may be achieved as the OPC for the set of pattern features can have been performed well (e.g., by taking a longer time than would otherwise be available). Additionally or alternatively, consistency may be achieved as the "re-pasting" can avoid inconsistent results if the same set of pattern features would yield different optimal proximity corrections. So, advanced OPC can be used while keeping total runtime within specification. Moreover, it can enable more consistent OPC.

This hierarchical mode can be particularly useful for devices with numerous repeating sets of pattern features. For example, memory devices (e.g., SRAM, DRAM, memory portions of integrated circuits, etc.) can be particularly suited for this since they typically comprise a plurality of essentially same cells or banks. Thus, OPC can be performed for one of these cells or banks and then the OPC result or recipe "re-pasted."

But, for this hierarchical mode, a hierarchy (e.g., an original GDS hierarchy) is used to enable the "re-pasting." That is, the hierarchical OPC mode relies on an input design pattern layout hierarchy. However, in some cases, there is no hierarchy (e.g., a flattened GDS) or the hierarchy is not optimal, overly complicated, or faulty. For example, due to re-targeting prior to OPC, the input design pattern layout hierarchy is sometimes lost and/or flattened out, in which the OPC would be run in a flattened mode (i.e., not a hierarchical mode). At times, the input design layout hierarchy is "bad" and not amenable to usage in OPC, in which the OPC would be run in a flattened mode (i.e., not a hierarchical mode).

So, in an embodiment, there is provided a method of identifying a hierarchy and applying it to OPC to enable, for example, significant speed up OPC runtime. That is, before OPC, a design pattern layout that, e.g., doesn't have a hierarchy or has an inadequate hierarchy, can be processed to create an appropriate hierarchy for the design pattern layout so that a hierarchical mode of OPC can be applied to the design pattern layout.

So, in an embodiment, there is provided a hierarchy identification method that comprises performing geometry-based pattern searching, recognition and matching of a design pattern layout. Based on the matching of an identified pattern within a design pattern layout, the hierarchy identification method can construct a hierarchy for the design pattern layout so that a hierarchical mode OPC can be applied to the design pattern layout.

In an embodiment, the hierarchy identification method comprises at least two general stages: a unit cell extraction stage and hierarchy building stage. In the unit cell extraction stage, geometric pattern-based searching and recognition is used to review at least a portion of the design pattern layout to search for repeating sets of polygons (i.e., a set of polygons that repeats multiple times with the at least portion of the design pattern layout) and one or more appropriate unit cells are recognized and extracted from the repeating sets of polygons. As discussed above, a unit cell will have an optimal proximity correction, whether created before the pattern-based searching and recognition (e.g., a unit cell from a library of unit cells, each unit cell having an OPC) or created after recognition of the unit cell (e.g., performing OPC on the unit after recognition in a design pattern layout), that can be "re-pasted" as discussed hereafter.

With the identified one or more unit cells, the design pattern layout can be searched for instances of the one or more identified unit cells. Matching instances of the unit cell(s) in the design pattern layout can then be identified, and then a hierarchy can be built that identifies the instances and locations of the matching unit cell(s) in the design pattern layout. In an embodiment, a hierarchy comprises an identification of one or more unit cells (or of structures corresponding to the one or more unit cells), a specification of the number of instances of the unit cell (or of the structures corresponding to the unit cell) in at least a portion of the design pattern layout, and a locational identification of the instances in the at least portion of the design pattern layout. The hierarchy can then be used in a hierarchical mode OPC process to "re-paste" the OPC result or recipe corresponding to the unit cell in the appropriate locations of the design pattern layout.

Referring to FIG. 8, an embodiment of a hierarchy identification method is depicted. In an embodiment, the method is implemented by software. In particular, in an embodiment, the method is implemented as part of an OPC software package to perform OPC of a design pattern layout.

So, at 800, a design pattern layout is obtained. Further, at least a portion of the design pattern layout is searched for at least one repeating set of polygons (e.g., one set of repeating of polygons or a plurality of different sets of repeating polygons) and then a region of the at least one repeating sets of polygons are automatically identified. Computer pattern recognition and matching techniques known in the art can be used for this. In an embodiment, a set of polygons is a two-dimensional array of polygons.

Figures 8A, 8B, 8C:
FIGS. 8A, 8B and 8C schematically illustrate an embodiment of identifying a unit cell from a design pattern layout.
Figures 9A, 9B, 9C:
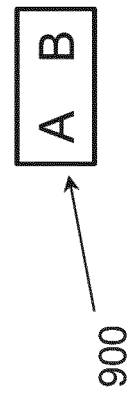
FIGS. 9A, 9B and 9C schematically illustrate an embodiment of identifying a unit cell from a design pattern layout.

A highly schematic examples design pattern layouts with polygons are shown in FIGS. 8A and 9A, wherein the letters A and B represent polygons. In this example, the letters A and B further respectively represents a same set of polygons. Thus, at 800, a region of a repeating set A of polygons can identified as shown at FIG. 8B. That is, a region, such as depicted in FIG. 8B, having the set A of polygons is identified. Similarly, at 800, a region of repeating sets A and B of polygons can identified as shown at FIG. 9B. That is, a region, such as depicted in FIG. 9B, having the sets A and B of polygons is identified.

In an embodiment, the searching and identification can be performed on the full design pattern layout. That is, in an embodiment, a user only provides the design pattern layout file(s). In an embodiment, a hint of the location and/or type of repeating set of polygons can be used. For example, in an embodiment, a clip window, a cover layer, or a cell name and/or instance, is specified across part of the design pattern layout. For example, a GDS layer can be specified from which to extract the unit cell (e.g., to extract the unit cell from only the layer), a crop window of the design pattern layout can be specified from which to extract the unit cell (e.g., to extract the unit cell from only the cropped area), and/or a cover layer can be specified from which to extract the unit cell (e.g., to extract the unit cell from only the covered area). For example, a user can provide a hint such as the location of an expected repeating set of polygons and/or an expected layout of a set of repeating polygons. In particular, as an example, a user may identify a memory device region in the design pattern layout, wherein the memory device region is expected to have a plurality of memory cells or banks which will typically have a set of polygons that repeat across the plurality of memory cells or banks. In an embodiment, a target design layout hierarchy can be provided, which includes identification of one or more expected unit cells (or of the structures corresponding to one or more expected unit cells) and/or locations of instances of one or more expected unit cells (or of the structures corresponding to one or more expected unit cells). The software can then evaluate at least a portion of the design pattern layout to identify whether the target unit cell(s) is in the design pattern layout and then identify the region and/or search the locations identified in the target design layout hierarchy to identify a region of at least one repeating set of polygons.

At 810, given a region of repeating polygonal sets, one or more unit cells can be identified. A unit cell corresponds to a collection of polygons in a particular spatial relationship that repeats a plurality of times (with the particular spatial relationship) within at least the region of repeating polygon sets of the design pattern layout. In an embodiment, the unit cell comprises a two-dimensional array of polygons. In an embodiment, the unit cell comprises a one-dimensional array of polygons.

In an embodiment, the unit cell is such that a region of the design pattern layout can be tessellated with the unit cell. So, in an embodiment, there cannot be any overlap between the unit cells to make an array. In an embodiment, the unit cell is such that a region of the design pattern layout can only have the unit cell arranged in perpendicular directions (e.g., X and Y directions).

In an embodiment, the unit cell is a minimum sized unit cell in the device pattern layout. That is, in an embodiment, the minimum sized unit cell comprises the fewest number of polygons within the boundary of the unit cell.

In an embodiment, the unit cell is specified such that polygons within the unit cell have symmetry with respect to at least one axis through the unit cell. In an embodiment, the polygons in the unit cell have point symmetry.

In an embodiment, the unit cell is specified such that the boundary of the unit cell does not pass through any polygons. In an embodiment, a plurality of different unit cells can be identified.

In an embodiment, the unit cell is identified by tracking pitches of polygons within the design pattern layout. For example, one or more sets of polygons can be included in a unit cell if a common pitch between polygons of a repeating set of polygons can be identified and then a common pitch among that repeating set across at least part of the design pattern layout is identified. Further, single polygons can be included in the unit cell area if there is a common pitch among the single polygons in the design pattern layout. In particular, in an embodiment, the single polygons will have a same pitch as the set of polygons included in the unit cell area. In an embodiment, a unit cell area can comprises just different single polygons if each single polygon has a common pitch among the same single polygons across the design pattern layout and the pitch is common among the different single polygons. In an embodiment, to identify the polygons for a unit cell, the vertices of the polygons are tracked across the design pattern layout and a greatest common pitch is identified.

A highly schematic example of a unit cell 900 is depicted in FIG. 8C that can be identified from FIG. 8B. As seen, the unit cell A can be tessellated within the region of FIG. 8B and is defined such that the unit cell boundary doesn't pass through any of the polygons of the unit cell. A further highly schematic example of a unit cell 900 is depicted in FIG. 9C that can be identified from FIG. 9B. As seen, the unit cell A and B can be tessellated within the region of FIG. 9B and is defined such that the unit cell boundary doesn't pass through any of the polygons of the unit cell. A unit cell in the example of FIG. 9B could be a unit cell A (rather unit cell A and B shown in FIG. 9C), however, the unit cell can be advantageously unit cell A and B of FIG. 9C because it can be tessellated in two orthogonal directions within the region of FIG. 9B (whereas unit cell A could not be so tessellated in that region).

Referring to FIGS. 10A and 10B, a more practical, yet highly schematic, example of a unit cell 900 is depicted in FIG. 10B. As seen in FIG. 10B, the unit cell 900 comprises a plurality of polygons in a two-dimensional arrangement. The unit cell 900 can be identified from the design pattern layout 1020 seen in FIG. 10A. As shown in 1000, the unit cell 900 can be tessellated to a layout comparable to a region of the design pattern layout 1020 shown in FIG. 10A. FIG. 10A further shows a unit cell 1010 that can be specified for the design pattern layout 1020. This unit cell 1010 however cuts through a polygon within the boundary of the unit cell 1010.

Further, FIG. 10A shows an example of identifying a unit cell by tracking pitches of polygons within the design pattern layout. For example, one or more sets of polygons can be included in a unit cell if a common pitch 1030 between polygons of a repeating set of polygons can be identified and then a common pitch 1040 among that repeating set across at least part of the design pattern layout is identified. Further, single polygons can be included in the unit cell area if there is a common pitch 1050 among the single polygons in the design pattern layout. As seen, in FIG. 10A, the single polygon with common pitch 1050 has a same pitch as the common pitch 1040 of the set of polygons (with a pitch 1030) and so is included in the unit cell area with the set of polygons.

Figure 12:
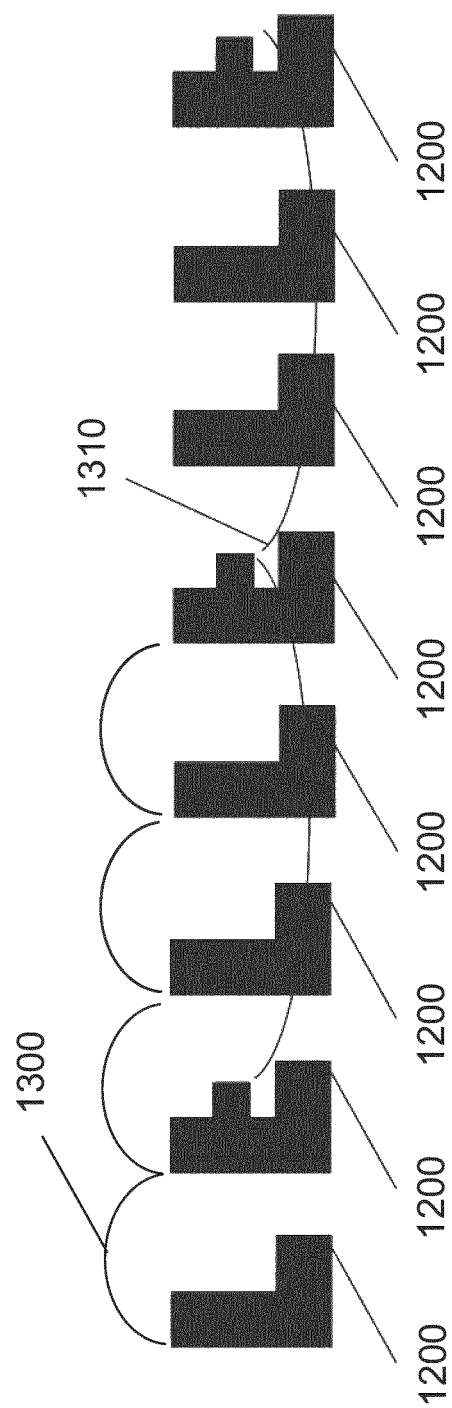
FIG. 12 schematically illustrates an embodiment of identifying a unit cell.

FIGS. 11 and 12 show further schematic examples of identifying pitch and finding a common pitch. As discussed above, a repeating set of polygons would be identified in a certain area of the design pattern layout (e.g., the full layout or a portion thereof). Then, pitches among the polygons would be identified. For example, FIG. 11 depicts a set of such polygons 1200. From those polygons, various pitches can be selected for tracking. For example, pitch 1210 can be tracked, which measures of a top left corner of the same polygons. As another example, pitch 1220 can be tracked, which measures at an inner corner of the same polygons. Through such tracking, it can be determined, for example, whether the polygons have a regular orientation and do not have differing orientations. Such tracking can also be used to identify one or more least common pitches among the polygons, which can then be used to identify the unit cell. So, once a repeating zone is identified, one or more least common pitches can be identified. FIG. 12 shows an example of identifying a least common pitch in a particular direction. In this case, a repeating set of polygons has a first pitch 1300 (e.g., 0.4 microns) in a particular direction and a second pitch 1310 (e.g., 0.6 microns) in the direction, so a mathematical processing of these pitches 1300, 1310 can then yield a least common pitch (e.g., 1.2 microns where pitch 1300 is 0.4 microns and pitch 1310 is 0.6 microns) in the direction. Then, with the one or more least common pitches, the polygons in the repeating zone can then be "cut" by the one or more least common pitches to extract the unit cell. Desirably, the "cutting" avoids cutting a polygon.

Figure 13B:
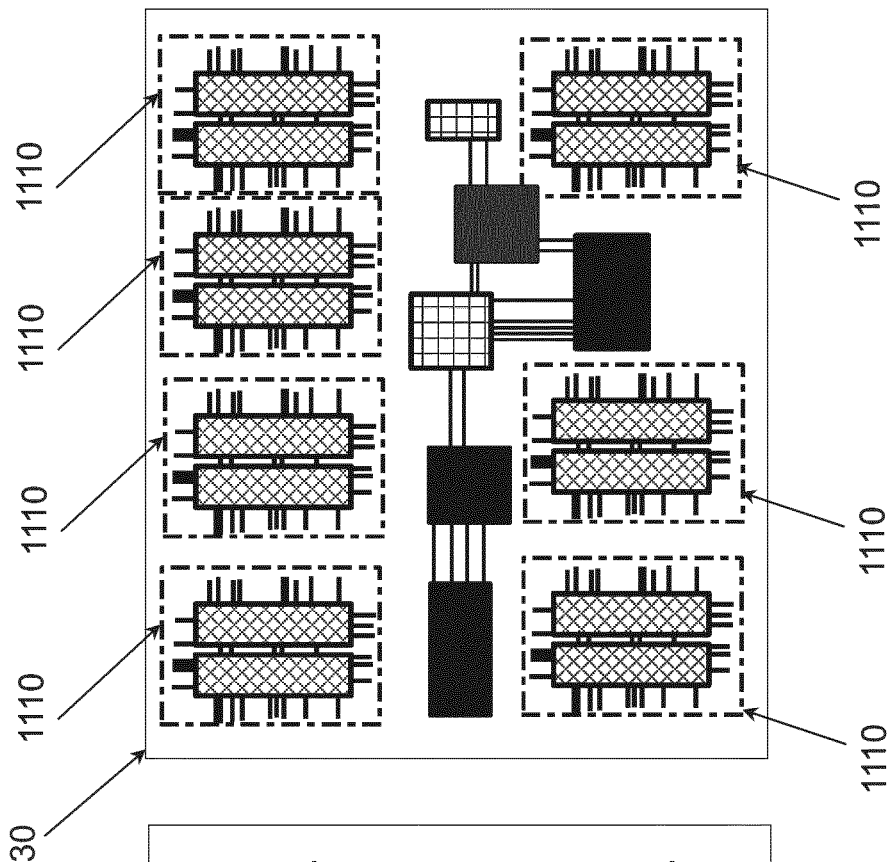
FIGS. 13A and 13B schematically illustrate an embodiment of a design pattern layout with an identified large area unit cell and instances of the unit cell in the design pattern layout.
Figure 13A:
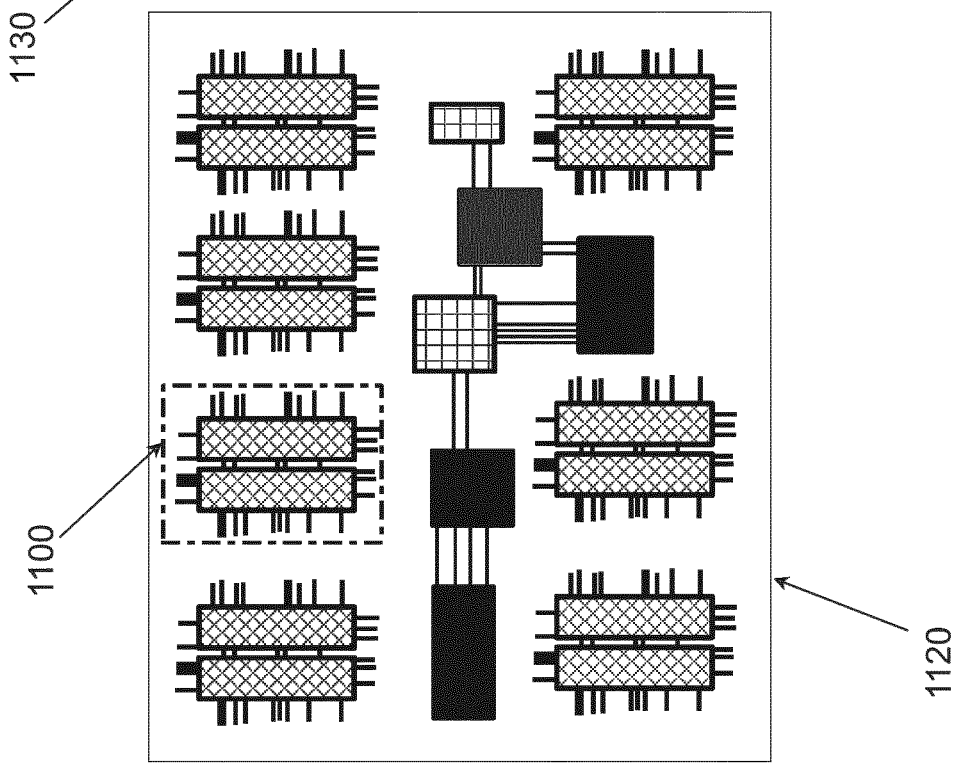

FIGS. 13A and 13B show a hypothetical practical application for larger areas. As seen in FIG. 13A, the unit cell 1100 comprises a plurality of polygons in a two-dimensional arrangement. While some of the structures appear mostly as single large integrated structures in FIGS. 13A and 13B, they can comprise a plurality of polygons not visible in the highly schematic representation of FIGS. 13A and 13B; that is, those polygons would appear if those large integrated structures were rendered as real design pattern layouts). The unit cell 1100 can be identified from the design pattern layout 1120 seen in FIG. 13A. As shown in 1130, the unit cell 1100 can be tessellated to a layout comparable to a region of the design pattern layout 1120 shown in FIG. 13A. As seen in FIG. 13B, the unit cell 1100 can be tessellated into a plurality of instances 1110 in FIG. 13B. Thus, a design pattern layout 1120, e.g., without a hierarchy can be decomposed into one or more unit cells (such as unit cell 1100) which can then be used to create a hierarchy that identifies the instances (e.g., instances 1110) of the unit cell within the design pattern layout (e.g., the entire design pattern layout 1120). So, by extending this technique to large areas, a hierarchy can be built on, e.g., cores for a multi-core CPU or memory banks for a DRAM chip. Hence, this technique can be applied to smaller cells in, e.g., a memory array (e.g., SRAM, DRAM, NAND) or for larger cells, such as cores and banks.

At 820, given one or more identified unit cells, occurrences (e.g., all occurrences) in the full design pattern layout, or in a specified region of the design pattern layout, can be located and identified. For example, a user can specify a GDS layer to search for matching instances of the unit cell to enable the hierarchy to be built (e.g., to be matched only in the layer), can specify a crop window to search for matching instances of the unit cell to enable the hierarchy to be built (e.g., to be matched only in the cropped area) and/or can specify a cover layer to search for matching instances of the unit cell to enable the hierarchy to be built (e.g., to be matched only in the covered area). For example, an automated search can be performed of the design pattern layout of a memory device to match memory cells or banks with the unit cell, which matched instances of the unit cell can then be used to build a hierarchy at least in the memory cell or bank area based on the extracted instances of the unit cell. In some instances, OPC may be performed on patches (i.e., sub regions) of the design pattern layout. For example, the patches may be 20×20 micron regions or 30×30 micron regions tessellated across the design pattern layout. Accordingly, the identification of occurrences can ensure consistency across the multiple patches by, for example, not recognizing an instance of a unit cell that crosses a boundary between patches or by providing an indicator that an instance of a unit cell crosses a boundary between patches (which indicator can then be used to split the OPC of the unit cell across the patches).

At 830, a hierarchy is built using the identified locations of the instances of the one or more unit cells. In an embodiment, the hierarchy is built for the full design pattern layout. In an embodiment, the hierarchy is built for a user specified region (e.g., a memory device) of the design pattern layout.

An example graphical depiction of the hierarchy is represented in 1000 of FIG. 10B. As seen there, the unit cell 900 in FIG. 10B is repeated as a plurality of instances laid out in a tessellated two-dimensional arrangement. Thus, in an embodiment, the hierarchy would comprise an identification of unit 900 in FIG. 10B (or of structures corresponding to the one or more unit cells), a specification of the number of instances of the unit cell (or of the structures corresponding to the unit cell) in at least a portion of the design pattern layout (e.g., in the example of FIG. 10B, 12 instances), and a locational identification of the instances in the at least portion of the design pattern layout (e.g., in the example of FIG. 10B, a 2×6 array, or specific spatial locations, etc.).

At 840, OPC can be performed using the hierarchy from 830. That is, in an embodiment, hierarchical mode OPC can be used to process the hierarchy and then paste the OPC result or recipe corresponding to the unit cell at the instances of the unit cell within design pattern layout identified by the hierarchy. So, in an embodiment, OPC software first calls a hierarchy identified process of 800-830 to create a hierarchy which is then used by the OPC software at 840 to perform OPC on the design pattern layout. In an embodiment, the OPC for a particular unit cell can vary for different locations within a design pattern layout. For example, the OPC for unit cells surrounded by other instances of the unit cell can have a different OPC than a unit cell that is not surrounded by the other instances of the unit cell. This is because of the different arrangement of structures adjacent the non-surrounded instances of the unit cell. Thus, a unit cell can have different versions of optical proximity correction and the use of the different versions can be location-dependent.

In an embodiment, the hierarchy at 830 can be used to provide a hierarchy to a design pattern layout that is provided to the OPC software without an associated hierarchy. In an embodiment, the hierarchy at 830 can be used to provide a hierarchy to a design pattern layout that is provided to the OPC software with an ineffective, bad, etc. hierarchy. In an embodiment, the hierarchy at 830 can be used to replace a hierarchy of a design pattern layout that is provided to the OPC software.

So, in a specific example, a hierarchical mode can be used a memory cell or bank area of a flattened GDS thereof or without using an original GDS hierarchy therefor, by using a pattern searching, recognition and matching method to create the hierarchy for the hierarchical model.

So, in an embodiment, the techniques described herein provide an advance in patterning device data preparation that can enable faster and/or higher quality OPC. So, in an embodiment, there is provided an automatic identification and extraction of repeating polygonal arrays or blocks from a semiconductor device design pattern layout that can enable repetitive application of OPC for that those repeating polygonal arrays or blocks to enable faster time to exposed substrates with improved yield.

In an embodiment, there is provided a method, comprising: obtaining a device design pattern layout comprising a plurality of design pattern polygons; automatically identifying, by a computer, a unit cell of polygons in the device design pattern layout; identifying a plurality of occurrences of the unit cell within the device design pattern layout to build a hierarchy; and performing, by the computer, an optical proximity correction on the device design pattern layout by repeatedly applying an optical proximity correction designed for the unit cell to the occurrences of the unit cell in the hierarchy.

In an embodiment, the unit cell is a minimum sized unit cell in the device design pattern layout. In an embodiment, the unit cell is specified such that the boundary of the unit cell does not pass through any polygons. In an embodiment, the unit cell is specified such that it can be tessellated within a region of the device design pattern layout. In an embodiment, the unit cell can be tessellated in at least two orthogonal directions within the device design pattern layout. In an embodiment, the unit cell is specified such that polygons within the unit cell have symmetry with respect to at least one axis through the unit cell. In an embodiment, the method further comprises automatically identifying a region of repeating sets of polygons from the device design pattern layout and the identifying the unit cell comprises evaluating the region of the repeating sets of polygons to determine the unit cell. In an embodiment, the method further comprises receiving a specification of a sub-region of the device design pattern layout in which to identify the unit cell and identifying the plurality of occurrences of the unit cell comprises identifying an occurrence of the unit cell in the device design pattern layout outside of the sub-region. In an embodiment, the hierarchy comprises an identification of the unit cell (or of structures corresponding to the unit cell), a specification of the number of instances of the unit cell (or of the structures corresponding to the unit cell) in at least a portion of the device design pattern layout, and a locational identification of the instances in the at least portion of the device design pattern layout. In an embodiment, the method further comprises performing, by the computer, an optical proximity correction on the unit cell to create the optical proximity correction designed for the unit cell. In an embodiment, the device design pattern layout corresponds to a memory device and the unit cell corresponds to polygons for a cell or bank of the memory device. In an embodiment, the unit cell is identified by tracking a plurality of pitches between polygons. In an embodiment, prior to automatically identifying the unit cell, the device design pattern layout does not have an available hierarchy. In an embodiment, no prior hierarchy information is used to create the hierarchy.

In an embodiment, there is provided a method, comprising: obtaining a device design pattern layout comprising a plurality of design pattern polygons; automatically identifying, by a computer, a unit cell of polygons in the device design pattern layout; identifying a plurality of occurrences of the unit cell within the device design pattern layout; and building, by the computer, a hierarchy based on the identified plurality of occurrences, the hierarchy designed for use in an optical proximity correction of the device design pattern layout.

In an embodiment, the method further comprises performing, by the computer, an optical proximity correction based on the hierarchy for the device design pattern layout by repeatedly applying an optical proximity correction designed for the unit cell to the occurrences of the unit cell in the hierarchy.

In an embodiment, the unit cell is a minimum sized unit cell in the device design pattern layout. In an embodiment, the unit cell is specified such that the boundary of the unit cell does not pass through any polygons. In an embodiment, the unit cell is specified such that it can be tessellated within a region of the device design pattern layout. In an embodiment, the unit cell can be tessellated in at least two orthogonal directions within the device design pattern layout. In an embodiment, the unit cell is specified such that polygons within the unit cell have symmetry with respect to at least one axis through the unit cell. In an embodiment, the method further comprises automatically identifying a region of repeating sets of polygons from the device design pattern layout and the identifying the unit cell comprises evaluating the region of the repeating sets of polygons to determine the unit cell. In an embodiment, the method further comprises receiving a specification of a sub-region of the device design pattern layout in which to identify the unit cell and identifying the plurality of occurrences of the unit cell comprises identifying an occurrence of the unit cell in the device design pattern layout outside of the sub-region. In an embodiment, the hierarchy comprises an identification of the unit cell (or of structures corresponding to the unit cell), a specification of the number of instances of the unit cell (or of the structures corresponding to the unit cell) in at least a portion of the device design pattern layout, and a locational identification of the instances in the at least portion of the device design pattern layout. In an embodiment, the method further comprises performing, by the computer, an optical proximity correction on the unit cell to create an optical proximity correction designed for the unit cell. In an embodiment, the device design pattern layout corresponds to a memory device and the unit cell corresponds to polygons for a cell or bank of the memory device. In an embodiment, the unit cell is identified by tracking a plurality of pitches between polygons. In an embodiment, prior to automatically identifying the unit cell, the device design pattern layout does not have an available hierarchy. In an embodiment, no prior hierarchy information is used to create the hierarchy.

As will be appreciated by one of ordinary skill in the art, the present application may be embodied as a system, method, or computer program product. Accordingly, aspects of the present application may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present application may take the form of a computer program product embodied in any one or more computer readable medium(s) having computer usable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, device, or any suitable combination of the foregoing. More specific examples (a non-exhaustive list) of the computer readable medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CDROM), an optical storage device, a magnetic storage device, or any suitable combination of the foregoing. In the context of this document, a computer readable storage medium may be any tangible medium that can contain or store a program for use by or in connection with an instruction execution system, apparatus, or device.

A computer readable signal medium may include a propagated data signal with computer readable program code embodied therein, for example, in a baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Computer code embodied on a computer readable medium may be transmitted using any appropriate medium, including but not limited to wireless, wireline, optical fiber cable, radio frequency (RF), etc., or any suitable combination thereof.

Computer program code for carrying out operations for aspects of the present application may be written in any combination of one or more programming languages, including an object oriented programming language such as Java™, Smalltalk™, C++, or the like, and conventional procedural programming languages, such as the "C" programming language or similar programming languages. The program code may execute entirely on the user's computer, partly on the user's computer, as a stand-alone software package, partly on the user's computer and partly on a remote computer, or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

The computer program instructions may also be loaded onto a computer, other programmable data processing apparatus, or other devices to cause a series of operational steps to be performed on the computer, other programmable apparatus, or other devices to produce a computer implemented process such that the instructions which execute on the computer or other programmable apparatus provide processes for implementing the functions/acts specified in the flowchart and/or block diagram block or blocks.

As noted above, it should be appreciated that the illustrative embodiments may take the form of an entirely hardware embodiment, an entirely software embodiment or an embodiment containing both hardware and software elements. In one example embodiment, the mechanisms of the illustrative embodiments may be implemented in software or program code, which includes but is not limited to firmware, resident software, microcode, etc.

A data processing system suitable for storing and/or executing program code will include at least one processor coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution.

Input/output or I/O devices (including but not limited to keyboards, displays, pointing devices, etc.) can be coupled to the system either directly or through intervening I/O controllers. Network adapters may also be coupled to the system to enable the data processing system to become coupled to other data processing systems or remote printers or storage devices through intervening private or public networks. Modems, cable modems and Ethernet cards are just a few of the currently available types of network adapters.

The description of the present application has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

Figure 14:
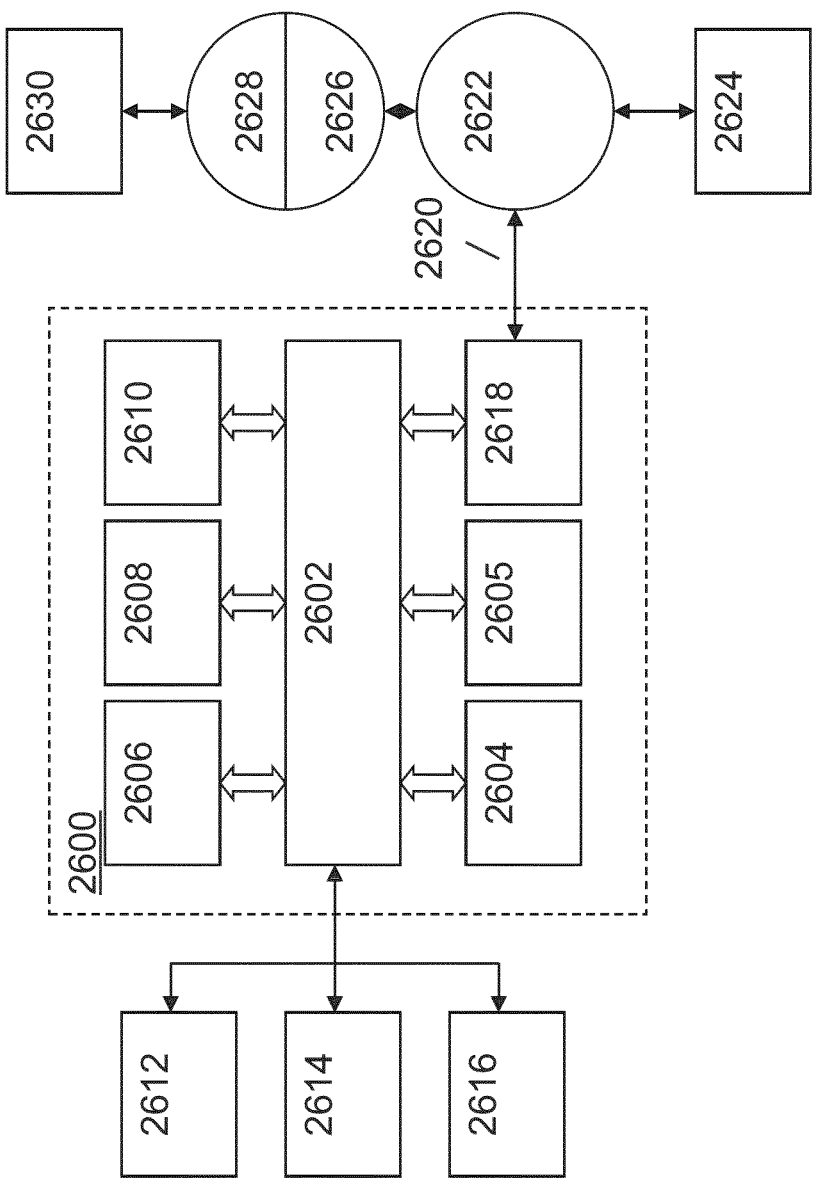
FIG. 14 illustrates a block diagram of an example computer system.

FIG. 14 is a block diagram that illustrates an embodiment of a computer system 2600 which can assist in implementing any of the methods and flows disclosed herein. Computer system 2600 includes a bus 2602 or other communication mechanism for communicating information, and a processor 2604 (or multiple processors 2604 and 2605) coupled with bus 2602 for processing information. Computer system 2600 also includes a main memory 2606, such as a random access memory (RAM) or other dynamic storage device, coupled to bus 2602 for storing information and instructions to be executed by processor 2604. Main memory 2606 also may be used for storing temporary variables or other intermediate information during execution of instructions to be executed by processor 2604. Computer system 2600 further includes a read only memory (ROM) 2608 or other static storage device coupled to bus 2602 for storing static information and instructions for processor 2604. A storage device 2610, such as a magnetic disk or optical disk, is provided and coupled to bus 2602 for storing information and instructions.

Computer system 2600 may be coupled via bus 2602 to a display 2612, such as a cathode ray tube (CRT) or flat panel or touch panel display for displaying information to a computer user. An input device 2614, including alphanumeric and other keys, is coupled to bus 2602 for communicating information and command selections to processor 2604. Another type of user input device is cursor control 2616, such as a mouse, a trackball, or cursor direction keys for communicating direction information and command selections to processor 2604 and for controlling cursor movement on display 2612. This input device typically has two degrees of freedom in two axes, a first axis (e.g., x) and a second axis (e.g., y), that allows the device to specify positions in a plane. A touch panel (screen) display may also be used as an input device.

According to one embodiment, portions of a process described herein may be performed by computer system 2600 in response to processor 2604 executing one or more sequences of one or more instructions contained in main memory 2606. Such instructions may be read into main memory 2606 from another computer-readable medium, such as storage device 2610. Execution of the sequences of instructions contained in main memory 2606 causes processor 2604 to perform the process steps described herein. One or more processors in a multi-processing arrangement may also be employed to execute the sequences of instructions contained in main memory 2606. In an alternative embodiment, hard-wired circuitry may be used in place of or in combination with software instructions. Thus, the description herein is not limited to any specific combination of hardware circuitry and software.

The term "computer-readable medium" as used herein refers to any medium that participates in providing instructions to processor 2604 for execution. Such a medium may take many forms, including but not limited to, non-volatile media, volatile media, and transmission media. Non-volatile media include, for example, optical or magnetic disks, such as storage device 2610. Volatile media include dynamic memory, such as main memory 2606. Transmission media include coaxial cables, copper wire and fiber optics, including the wires that comprise bus 2602. Transmission media can also take the form of acoustic or light waves, such as those generated during radio frequency (RF) and infrared (IR) data communications. Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, and EPROM, a FLASH-EPROM, any other memory chip or cartridge, a carrier wave as described hereinafter, or any other medium from which a computer can read.

Various forms of computer readable media may be involved in carrying one or more sequences of one or more instructions to processor 2604 for execution. For example, the instructions may initially be borne on a magnetic disk of a remote computer. The remote computer can load the instructions into its dynamic memory and send the instructions over a telephone line using a modem. A modem local to computer system 2600 can receive the data on the telephone line and use an infrared transmitter to convert the data to an infrared signal. An infrared detector coupled to bus 2602 can receive the data carried in the infrared signal and place the data on bus 2602. Bus 2602 carries the data to main memory 2606, from which processor 2604 retrieves and executes the instructions. The instructions received by main memory 2606 may optionally be stored on storage device 2610 either before or after execution by processor 2604.

Computer system 2600 may also include a communication interface 2618 coupled to bus 2602. Communication interface 2618 provides a two-way data communication coupling to a network link 2620 that is connected to a local network 2622. For example, communication interface 2618 may be an integrated services digital network (ISDN) card or a modem to provide a data communication connection to a corresponding type of telephone line. As another example, communication interface 2618 may be a local area network (LAN) card to provide a data communication connection to a compatible LAN. Wireless links may also be implemented. In any such implementation, communication interface 2618 sends and receives electrical, electromagnetic or optical signals that carry digital data streams representing various types of information.

Network link 2620 typically provides data communication through one or more networks to other data devices. For example, network link 2620 may provide a connection through local network 2622 to a host computer 2624 or to data equipment operated by an Internet Service Provider (ISP) 2626. ISP 2626 in turn provides data communication services through the worldwide packet data communication network, now commonly referred to as the "Internet" 2628. Local network 2622 and Internet 2628 both use electrical, electromagnetic or optical signals that carry digital data streams. The signals through the various networks and the signals on network link 2620 and through communication interface 2618, which carry the digital data to and from computer system 2600, are exemplary forms of carrier waves transporting the information.

Computer system 2600 can send messages and receive data, including program code, through the network(s), network link 2620, and communication interface 2618. In the Internet example, a server 2630 might transmit a requested code for an application program through Internet 2628, ISP 2626, local network 2622 and communication interface 2618. One such downloaded application may provide for a method or portion thereof as described herein, for example. The received code may be executed by processor 2604 as it is received, and/or stored in storage device 2610, or other non-volatile storage for later execution. In this manner, computer system 2600 may obtain application code in the form of a carrier wave.

Figure 15:
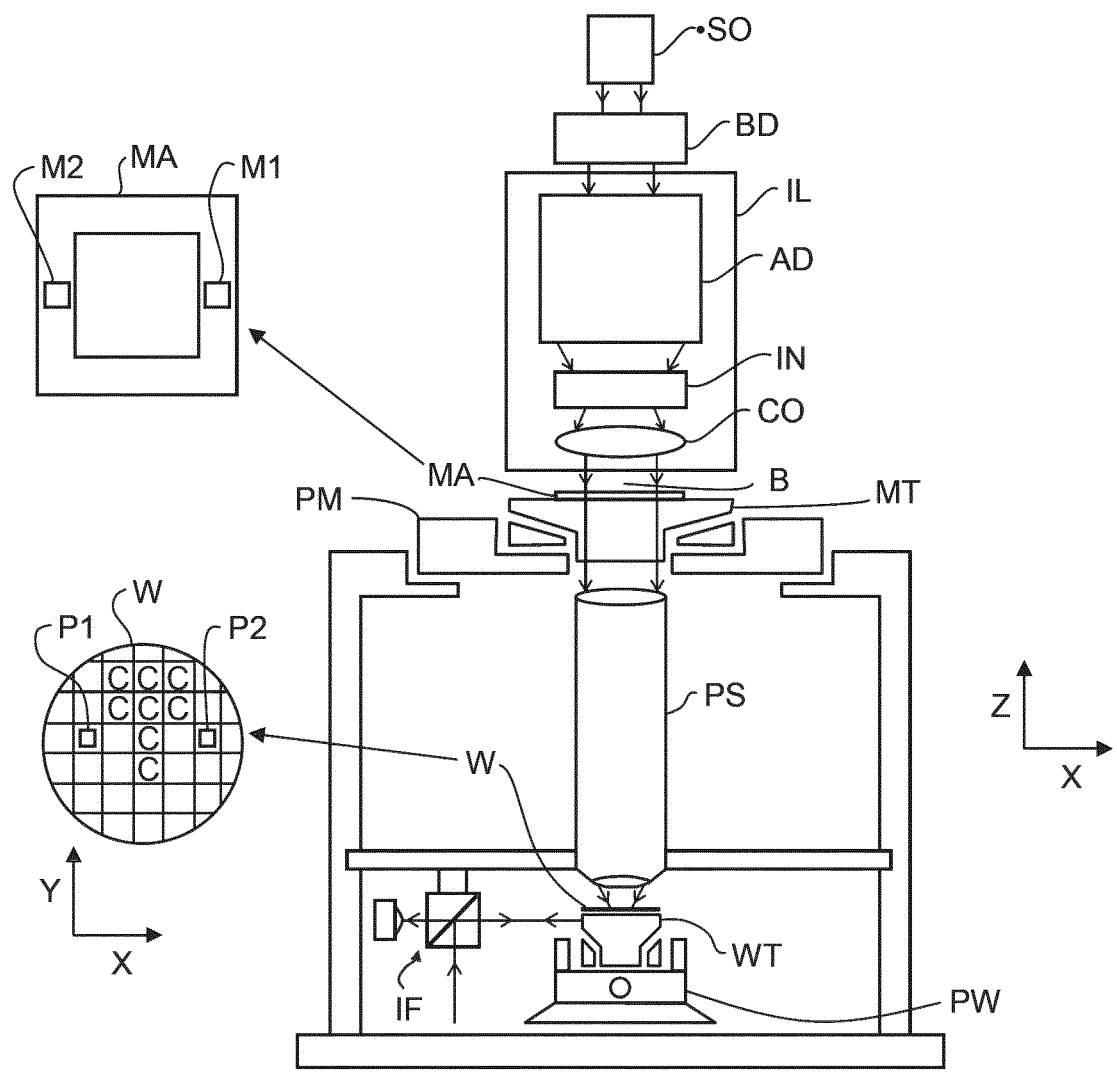
FIG. 15 illustrates a schematic diagram of a lithography apparatus.

FIG. 15 schematically depicts an exemplary lithography apparatus in association with which the techniques described herein can be utilized. The apparatus comprises: an illumination system IL, to condition a beam B of radiation. In this particular case, the illumination system also comprises a radiation source SO; a first object table (e.g., patterning device table) MT provided with a patterning device holder to hold a patterning device MA (e.g., a reticle), and connected to a first positioner to accurately position the patterning device with respect to item PS; a second object table (substrate table) WT provided with a substrate holder to hold a substrate W (e.g., a resist-coated silicon wafer), and connected to a second positioner to accurately position the substrate with respect to item PS; a projection system ("lens") PS (e.g., a refractive, catoptric or catadioptric optical system) to image an irradiated portion of the patterning device MA onto a target portion C (e.g., comprising one or more dies) of the substrate W.

As depicted herein, the apparatus is of a transmissive type (i.e., has a transmissive patterning device). However, in general, it may also be of a reflective type, for example (with a reflective patterning device). The apparatus may employ a different kind of patterning device to classic mask; examples include a programmable mirror array or LCD matrix.

The source SO (e.g., a mercury lamp or excimer laser, LPP (laser produced plasma) EUV source) produces a beam of radiation. This beam is fed into an illumination system (illuminator) IL, either directly or after having traversed conditioning means, such as a beam expander Ex, for example. The illuminator IL may comprise adjusting means AD for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam B impinging on the patterning device MA has a desired uniformity and intensity distribution in its cross-section.

It should be noted with regard to FIG. 15 that the source SO may be within the housing of the lithography apparatus (as is often the case when the source SO is a mercury lamp, for example), but that it may also be remote from the lithography apparatus, the radiation beam that it produces being led into the apparatus (e.g., with the aid of suitable directing mirrors); this latter scenario is often the case when the source SO is an excimer laser (e.g., based on KrF, ArF or $F_2$ lasing).

The beam PB subsequently intercepts the patterning device MA, which is held on a patterning device table MT. Having traversed the patterning device MA, the beam B passes through the projection system PL, which focuses the beam B onto a target portion C of the substrate W. With the aid of the second positioning means (and interferometric measuring means IF), the substrate table WT can be moved accurately, e.g. so as to position different target portions C in the path of the beam B. Similarly, the first positioning means can be used to accurately position the patterning device MA with respect to the path of the beam B, e.g., after mechanical retrieval of the patterning device MA from a patterning device library, or during a scan. In general, movement of the object tables MT, WT will be realized with the aid of a long-stroke module (coarse positioning) and a short-stroke module (fine positioning), which are not explicitly depicted in FIG. 15. However, in the case of a stepper (as opposed to a step-and-scan tool) the patterning device table MT may just be connected to a short stroke actuator, or may be fixed.

The depicted tool can be used in two different modes: In step mode, the patterning device table MT is kept essentially stationary, and an entire patterning device image is projected in one go (i.e., a single "flash") onto a target portion C. The substrate table WT is then shifted in the x and/or y directions so that a different target portion C can be irradiated by the beam B.

In scan mode, essentially the same scenario applies, except that a given target portion C is not exposed in a single "flash". Instead, the patterning device table MT is movable in a given direction (the so-called "scan direction", e.g., the y direction) with a speed v, so that the projection beam B is caused to scan over a patterning device image; concurrently, the substrate table WT is simultaneously moved in the same or opposite direction at a speed V=Mv, in which M is the magnification of the projection system PL (typically, M=¼ or ⅕). In this manner, a relatively large target portion C can be exposed, without having to compromise on resolution.

Further, the lithography apparatus may be of a type having two or more tables (e.g., two or more substrate table, a substrate table and a measurement table, two or more patterning device tables, etc.). In such "multiple stage" devices a plurality of the multiple tables may be used in parallel, or preparatory steps may be carried out on one or more tables while one or more other tables are being used for exposures. Twin stage lithography apparatuses are described, for example, in U.S. Pat. No. 5,969,441, incorporated herein by reference in its entirety.

Figure 16:
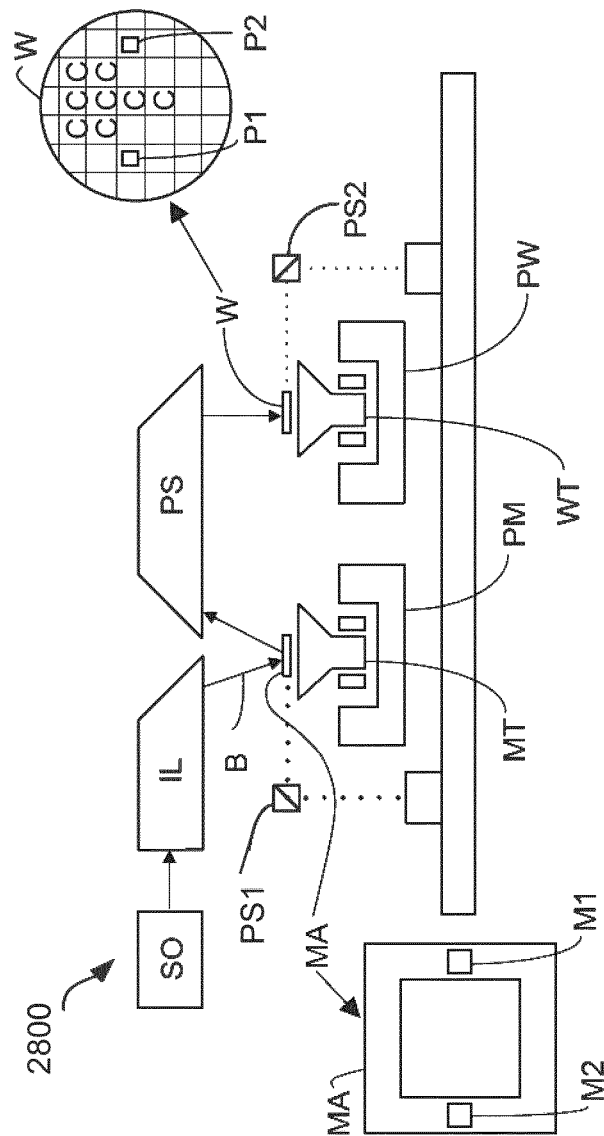
FIG. 16 illustrates a schematic diagram of another lithography apparatus.

FIG. 16 schematically depicts another exemplary lithography apparatus 2800 in association with which the techniques described herein can be utilized. The lithography apparatus 2800 comprises: a source collector module SO; an illumination system (illuminator) IL configured to condition a radiation beam B (e.g. EUV radiation); a support structure (e.g. a patterning device table) MT constructed to support a patterning device (e.g. a mask or a reticle) MA and connected to a first positioner PM configured to accurately position the patterning device; a substrate table (e.g. a wafer table) WT constructed to hold a substrate (e.g. a resist coated wafer) W and connected to a second positioner PW configured to accurately position the substrate; and a projection system (e.g. a reflective projection system) PS configured to project a pattern imparted to the radiation beam B by patterning device MA onto a target portion C (e.g. comprising one or more dies) of the substrate W.

As here depicted, the apparatus 2800 is of a reflective type (e.g. employing a reflective patterning device). It is to be noted that because most materials are absorptive within the EUV wavelength range, the patterning device may have multilayer reflectors comprising, for example, a multi-stack of Molybdenum and Silicon. In one example, the multi-stack reflector has a 40 layer pairs of molybdenum and silicon where the thickness of each layer is a quarter wavelength. Even smaller wavelengths may be produced with X-ray lithography. Since most material is absorptive at EUV and x-ray wavelengths, a thin piece of patterned absorbing material on the patterning device topography (e.g., a TaN absorber on top of the multi-layer reflector) defines where features would print (positive resist) or not print (negative resist).

Referring to FIG. 16, the illuminator IL receives an extreme ultra violet radiation beam from the source collector module SO. Methods to produce EUV radiation include, but are not necessarily limited to, converting a material into a plasma state that has at least one element, e.g., xenon, lithium or tin, with one or more emission lines in the EUV range. In one such method, often termed laser produced plasma ("LPP") the plasma can be produced by irradiating a fuel, such as a droplet, stream or cluster of material having the line-emitting element, with a laser beam. The source collector module SO may be part of an EUV radiation system including a laser for providing the laser beam exciting the fuel. The resulting plasma emits output radiation, e.g., EUV radiation, which is collected using a radiation collector, disposed in the source collector module. The laser and the source collector module may be separate entities, for example when a $CO_2$ laser is used to provide the laser beam for fuel excitation.

In such cases, the laser is not considered to form part of the lithographic apparatus and the radiation beam is passed from the laser to the source collector module with the aid of a beam delivery system comprising, for example, suitable directing mirrors and/or a beam expander. In other cases the source may be an integral part of the source collector module, for example when the source is a discharge produced plasma EUV generator, often termed as a DPP source.

The illuminator IL may comprise an adjuster for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as facetted field and pupil minor devices. The illuminator may be used to condition the radiation beam, to have a desired uniformity and intensity distribution in its cross section.

The radiation beam B is incident on the patterning device (e.g., mask) MA, which is held on the support structure (e.g., patterning device table) MT, and is patterned by the patterning device. After being reflected from the patterning device (e.g. mask) MA, the radiation beam B passes through the projection system PS, which focuses the beam onto a target portion C of the substrate W. With the aid of the second positioner PW and position sensor PS2 (e.g. an interferometric device, linear encoder or capacitive sensor), the substrate table WT can be moved accurately, e.g. so as to position different target portions C in the path of the radiation beam B. Similarly, the first positioner PM and another position sensor PS1 can be used to accurately position the patterning device (e.g. mask) MA with respect to the path of the radiation beam B. Patterning device (e.g. mask) MA and substrate W may be aligned using patterning device alignment marks M1, M2 and substrate alignment marks P1, P2.

The depicted apparatus 2800 could be used in at least one of the following modes:

In step mode, the support structure (e.g. patterning device table) MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed.

In scan mode, the support structure (e.g. patterning device table) MT and the substrate table WT are scanned synchronously while a pattern imparted to the radiation beam is projected onto a target portion C (i.e. a single dynamic exposure). The velocity and direction of the substrate table WT relative to the support structure (e.g. patterning device table) MT may be determined by the (de-)magnification and image reversal characteristics of the projection system PS.

In another mode, the support structure (e.g. patterning device table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Figure 17:
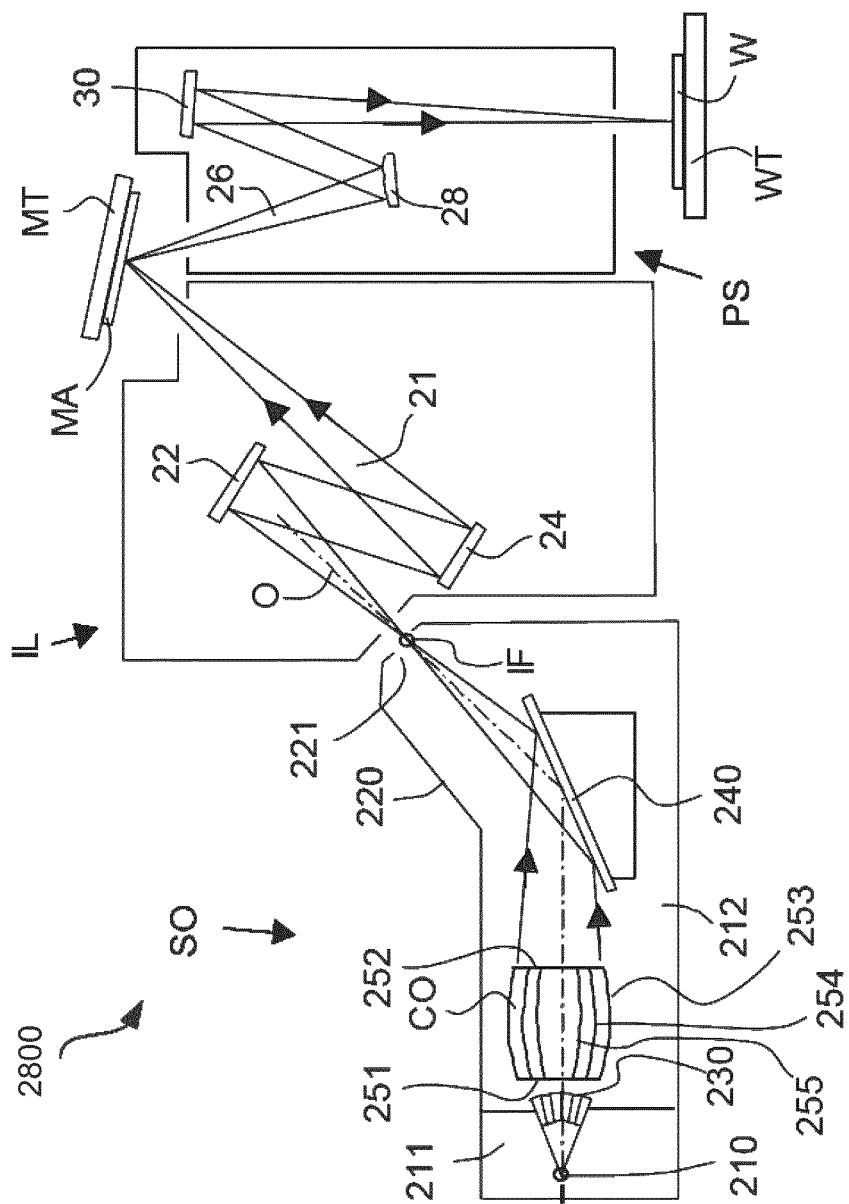
FIG. 17 illustrates a more detailed view of the apparatus in FIG. 16.

FIG. 17 shows the apparatus 2800 in more detail, including the source collector module SO, the illumination system IL, and the projection system PS. The source collector module SO is constructed and arranged such that a vacuum environment can be maintained in an enclosing structure 220 of the source collector module SO. An EUV radiation emitting plasma 210 may be formed by a discharge produced plasma source. EUV radiation may be produced by a gas or vapor, for example Xe gas, Li vapor or Sn vapor in which the very hot plasma 210 is created to emit radiation in the EUV range of the electromagnetic spectrum. The very hot plasma 210 is created by, for example, an electrical discharge causing an at least partially ionized plasma. Partial pressures of, for example, 10 Pa of Xe, Li, Sn vapor or any other suitable gas or vapor may be required for efficient generation of the radiation. In an embodiment, a plasma of excited tin (Sn) is provided to produce EUV radiation.

The radiation emitted by the hot plasma 210 is passed from a source chamber 211 into a collector chamber 212 via an optional gas barrier or contaminant trap 230 (in some cases also referred to as contaminant barrier or foil trap) which is positioned in or behind an opening in source chamber 211.

The contaminant trap 230 may include a channel structure. Contamination trap 230 may also include a gas barrier or a combination of a gas barrier and a channel structure. The contaminant trap or contaminant barrier 230 further indicated herein at least includes a channel structure, as known in the art.

The collector chamber 211 may include a radiation collector CO which may be a so-called grazing incidence collector. Radiation collector CO has an upstream radiation collector side 251 and a downstream radiation collector side 252. Radiation that traverses collector CO can be reflected off a grating spectral filter 240 to be focused in a virtual source point IF along the optical axis indicated by the dot-dashed line 'O'. The virtual source point IF is commonly referred to as the intermediate focus, and the source collector module is arranged such that the intermediate focus IF is located at or near an opening 221 in the enclosing structure 220. The virtual source point IF is an image of the radiation emitting plasma 210.

Subsequently the radiation traverses the illumination system IL, which may include a facetted field mirror device 22 and a facetted pupil mirror device 24 arranged to provide a desired angular distribution of the radiation beam 21, at the patterning device MA, as well as a desired uniformity of radiation intensity at the patterning device MA. Upon reflection of the beam of radiation 21 at the patterning device MA, held by the support structure MT, a patterned beam 26 is formed and the patterned beam 26 is imaged by the projection system PS via reflective elements 28, 30 onto a substrate W held by the substrate table WT.

More elements than shown may generally be present in illumination optics unit IL and projection system PS. The grating spectral filter 240 may optionally be present, depending upon the type of lithographic apparatus. Further, there may be more mirrors present than those shown in the figures, for example there may be 1-6 additional reflective elements present in the projection system PS than shown in FIG. 17.

Collector optic CO, as illustrated in FIG. 17, is depicted as a nested collector with grazing incidence reflectors 253, 254 and 255, just as an example of a collector (or collector mirror). The grazing incidence reflectors 253, 254 and 255 are disposed axially symmetric around the optical axis O and a collector optic CO of this type may be used in combination with a discharge produced plasma source, often called a DPP source.

Figure 18:
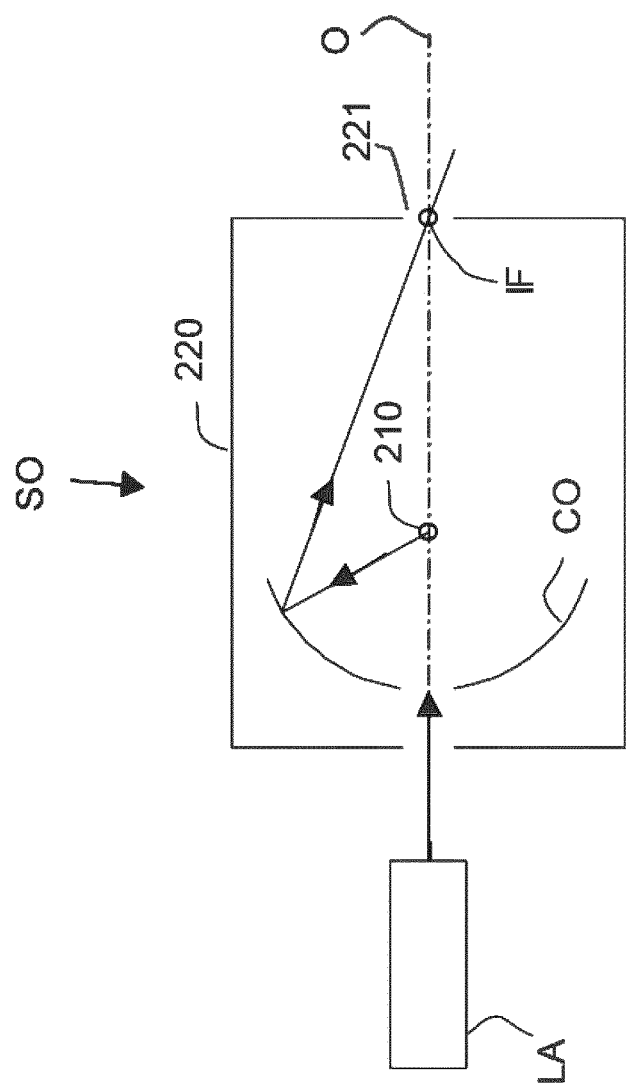
FIG. 18 illustrates a more detailed view of the source collector module SO of the apparatus of FIGS. 16 and 17 of the present application.

Alternatively, the source collector module SO may be part of an LPP radiation system as shown in FIG. 18. A laser LA is arranged to deposit laser energy into a fuel, such as xenon (Xe), tin (Sn) or lithium (Li), creating the highly ionized plasma 210 with electron temperatures of several 10's of eV. The energetic radiation generated during de-excitation and recombination of these ions is emitted from the plasma, collected by a near normal incidence collector optic CO and focused onto the opening 221 in the enclosing structure 220.

The embodiments may further be described using the following clauses:

1. A method, comprising:
obtaining a device design pattern layout comprising a plurality of design pattern polygons;
automatically identifying, by a computer, a unit cell of polygons in the device design pattern layout;
identifying a plurality of occurrences of the unit cell within the device design pattern layout to build a hierarchy; and
performing, by the computer, an optical proximity correction on the device design pattern layout by repeatedly applying an optical proximity correction designed for the unit cell to the occurrences of the unit cell in the hierarchy.
2. The method of clause 1, wherein the unit cell is a minimum sized unit cell in the device design pattern layout.
3. The method of clause 1 or clause 2, wherein the unit cell is specified such that the boundary of the unit cell does not pass through any polygons.
4. The method of any of clauses 1-3, wherein the unit cell is specified such that it can be tessellated within a region of the device design pattern layout.

5. The method of clause 4, wherein the unit cell can be tessellated in at least two orthogonal directions within the device design pattern layout.

6. The method of any of clauses 1-5, wherein the unit cell is specified such that polygons within the unit cell have symmetry with respect to at least one axis through the unit cell.

7. The method of any of clauses 1-6, further comprising automatically identifying a region of repeating sets of polygons from the device design pattern layout and the identifying the unit cell comprises evaluating the region of the repeating sets of polygons to determine the unit cell.

8. The method of any of clauses 1-7, further comprising receiving a specification of a sub-region of the device design pattern layout in which to identify the unit cell and identifying the plurality of occurrences of the unit cell comprises identifying an occurrence of the unit cell in the device design pattern layout outside of the sub-region.

9. The method of any of clauses 1-8, wherein the hierarchy comprises an identification of the unit cell (or of structures corresponding to the unit cell), a specification of the number of instances of the unit cell (or of the structures corresponding to the unit cell) in at least a portion of the device design pattern layout, and a locational identification of the instances in the at least portion of the device design pattern layout.

10. The method of any of clauses 1-9, further comprising performing, by the computer, an optical proximity correction on the unit cell to create the optical proximity correction designed for the unit cell.

11. The method of any of clauses 1-10, wherein the device design pattern layout corresponds to a memory device and the unit cell corresponds to polygons for a cell or bank of the memory device.

12. The method of any of clauses 1-11, wherein the unit cell is identified by tracking a plurality of pitches between polygons.

13. The method of any of clauses 1-12, wherein, prior to automatically identifying the unit cell, the device design pattern layout does not have an available hierarchy.

14. The method of any of clauses 1-13, wherein no prior hierarchy information is used to create the hierarchy.

15. A method, comprising:
obtaining a device design pattern layout comprising a plurality of design pattern polygons;
automatically identifying, by a computer, a unit cell of polygons in the device design pattern layout;
identifying a plurality of occurrences of the unit cell within the device design pattern layout; and
building, by the computer, a hierarchy based on the identified plurality of occurrences, the hierarchy designed for use in an optical proximity correction of the device design pattern layout.

16. The method of clause 15, further comprising performing, by the computer, an optical proximity correction based on the hierarchy for the device design pattern layout by repeatedly applying an optical proximity correction designed for the unit cell to the occurrences of the unit cell in the hierarchy.

17. The method of clause 15 or clause 16, wherein the unit cell is a minimum sized unit cell in the device design pattern layout.

18. The method of any of clauses 15-17, wherein the unit cell is specified such that the boundary of the unit cell does not pass through any polygons.

19. The method of any of clauses 15-18, wherein the unit cell is specified such that it can be tessellated within a region of the device design pattern layout.

20. The method of clause 19, wherein the unit cell can be tessellated in at least two orthogonal directions within the device design pattern layout.

21. The method of any of clauses 15-20, wherein the unit cell is specified such that polygons within the unit cell have symmetry with respect to at least one axis through the unit cell.

22. The method of any of clauses 15-21, further comprising automatically identifying a region of repeating sets of polygons from the device design pattern layout and the identifying the unit cell comprises evaluating the region of the repeating sets of polygons to determine the unit cell.

23. The method of any of clauses 15-22, further comprising receiving a specification of a sub-region of the device design pattern layout in which to identify the unit cell and identifying the plurality of occurrences of the unit cell comprises identifying an occurrence of the unit cell in the device design pattern layout outside of the sub-region.

24. The method of any of clauses 15-23, wherein the hierarchy comprises an identification of the unit cell (or of structures corresponding to the unit cell), a specification of the number of instances of the unit cell (or of the structures corresponding to the unit cell) in at least a portion of the device design pattern layout, and a locational identification of the instances in the at least portion of the device design pattern layout.

25. The method of any of clauses 15-24, further comprising performing, by the computer, an optical proximity correction on the unit cell to create an optical proximity correction designed for the unit cell.

26. The method of any of clauses 15-25, wherein the device design pattern layout corresponds to a memory device and the unit cell corresponds to polygons for a cell or bank of the memory device.

27. The method of any of clauses 15-26, wherein the unit cell is identified by tracking a plurality of pitches between polygons.

28. The method of any of clauses 15-27, wherein, prior to automatically identifying the unit cell, the device design pattern layout does not have an available hierarchy.

29. The method of any of clauses 15-28, wherein no prior hierarchy information is used to create the hierarchy.

30. A computer program product comprising a computer non-transitory readable medium having instructions recorded thereon, the instructions when executed by a computer implementing the method of any of clauses 1-29.

The concepts disclosed herein may simulate or mathematically model any generic imaging system for imaging sub wavelength features, and may be especially useful with emerging imaging technologies capable of producing increasingly shorter wavelengths. Emerging technologies already in use include EUV (extreme ultra violet), DUV lithography that is capable of producing a 193 nm wavelength with the use of an ArF laser, and even a 157 nm wavelength with the use of a Fluorine laser. Moreover, EUV lithography is capable of producing wavelengths within a range of 20-5 nm by using a synchrotron or by hitting a material (either solid or a plasma) with high energy electrons in order to produce photons within this range.

Although specific reference may be made in this text to the manufacture of ICs, it should be explicitly understood that the description herein has many other possible applications. For example, it may be employed in the manufacture of integrated optical systems, guidance and detection patterns for magnetic domain memories, liquid crystal display panels, thin film magnetic heads, etc. The skilled artisan will appreciate that, in the context of such alternative applications, any use of the terms "reticle", "wafer" or "die" in this text should be considered as interchangeable with the more general terms "mask", "substrate" and "target portion", respectively.

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range of about 5-100 nm).

The terms "optimizing" and "optimization" as used herein refers to or means adjusting a patterning apparatus (e.g., a lithography apparatus), a patterning process, etc. such that results and/or processes have more desirable characteristics, such as higher accuracy of projection of a design pattern layout on a substrate, a larger process window, etc. Thus, the term "optimizing" and "optimization" as used herein refers to or means a process that identifies one or more values for one or more parameters that provide an improvement, e.g. a local optimum, in at least one relevant metric, compared to an initial set of one or more values for those one or more parameters. "Optimum" and other related terms should be construed accordingly. In an embodiment, optimization steps can be applied iteratively to provide further improvements in one or more metrics.

While the concepts disclosed herein may be used for imaging on a substrate such as a silicon wafer, it shall be understood that the disclosed concepts may be used with any type of lithographic imaging systems, e.g., those used for imaging on substrates other than silicon wafers.

The descriptions above are intended to be illustrative, not limiting. Thus, it will be apparent to one skilled in the art that modifications may be made as described without departing from the scope of the claims set out below.

The invention claimed is:

1. A method, comprising:
obtaining a device design pattern layout comprising a plurality of design pattern polygons;
performing automatic pattern recognition, by a hardware computer, of a unit cell of polygons in the device design pattern layout;
searching for previously unidentified occurrences of the unit cell within the device design pattern layout to build a hierarchy; and
performing, by the computer, an optical proximity correction on the device design pattern layout by repeatedly applying an optical proximity correction designed for the unit cell to the occurrences of the unit cell in the hierarchy.

2. The method of claim 1, wherein the unit cell is specified such that polygons within the unit cell have symmetry with respect to at least one axis through the unit cell.

3. The method of claim 1, further comprising receiving a specification of a sub-region of the device design pattern layout in which to recognize the unit cell and identifying the plurality of occurrences of the unit cell comprises identifying an occurrence of the unit cell in the device design pattern layout outside of the sub-region.

4. The method of claim 1, wherein the unit cell is recognized by tracking a plurality of pitches between polygons.

5. The method of claim 1, wherein, prior to performing automatic pattern recognition of the unit cell, the device design pattern layout does not have an available hierarchy.

6. The method of claim 1, wherein no prior hierarchy information is used to create the hierarchy.

7. A computer program product comprising a non-transitory computer-readable medium having instructions recorded thereon, the instructions, upon execution by a computer system, configured to cause the computer system to at least:
obtain a device design pattern layout comprising a plurality of design pattern polygons;
perform automatic pattern recognition, by a hardware computer, of a unit cell of polygons in the device design pattern layout;
search for previously unidentified a plurality of occurrences of the unit cell within the device design pattern layout; and
build a hierarchy based on the identified plurality of occurrences, the hierarchy designed for use in an optical proximity correction of the device design pattern layout.

8. A computer program product comprising a non-transitory computer-readable medium having instructions recorded thereon, the instructions, upon execution by a computer system, configured to cause the computer system to at least:
obtain a device design pattern layout comprising a plurality of design pattern polygons;
perform automatic pattern recognition of a unit cell of polygons in the device design pattern layout;
search for previously unidentified occurrences of the unit cell within the device design pattern layout to build a hierarchy; and
perform an optical proximity correction on the device design pattern layout by repeatedly applying an optical proximity correction designed for the unit cell to the occurrences of the unit cell in the hierarchy.

9. The computer program product of claim 8, wherein the unit cell is a minimum sized unit cell in the device design pattern layout.

10. The computer program product of claim 8, wherein the unit cell is specified such that the boundary of the unit cell does not pass through any polygons.

11. The computer program product of claim 8, wherein the unit cell is specified such that it can be tessellated within a region of the device design pattern layout.

12. The computer program product of claim 8, wherein the unit cell is specified such that polygons within the unit cell have symmetry with respect to at least one axis through the unit cell.

13. The computer program product of claim 8, wherein the instructions are further configured to cause the computer system to perform an optical proximity correction on the unit cell to create the optical proximity correction designed for the unit cell.

14. The computer program product of claim 8, wherein the instructions are further configured to cause the computer system to automatically identify a region of repeating sets of polygons from the device design pattern layout and wherein the automatic pattern recognition comprises evaluation of the region of the repeating sets of polygons to determine the unit cell.

15. The computer program product of claim 8, wherein the hierarchy comprises an identification of the unit cell (or of structures corresponding to the unit cell), a specification of the number of instances of the unit cell (or of the structures corresponding to the unit cell) in at least a portion of the device design pattern layout, and a locational identification of the instances (or of the structures corresponding to the unit cell) in the at least portion of the device design pattern layout.

16. The computer program product of claim 8, wherein the instructions are further configured to cause the computer system to perform an optical proximity correction on the unit cell to create the optical proximity correction designed for the unit cell.

17. The computer program product of claim 8, wherein the device design pattern layout corresponds to a memory device and the unit cell corresponds to polygons for a cell or bank of the memory device.

18. The computer program product of claim 8, wherein the instructions are further configured to cause the computer system to recognize the unit cell by tracking a plurality of pitches between polygons.

19. The computer program product of claim 8, wherein, prior the automatic pattern recognition of the unit cell, the device design pattern layout does not have an available hierarchy.

20. The computer program product of claim 8, wherein no prior hierarchy information is used to create the hierarchy.

* * * * *